(12) United States Patent
Takahashi et al.

(10) Patent No.: US 10,414,943 B2
(45) Date of Patent: Sep. 17, 2019

(54) THERMOSETTING RESIN COMPOSITION, METHOD FOR PRODUCING RESIN COMPOSITION VARNISH, PREPREG AND LAMINATE

(71) Applicant: Hitachi Chemical Company, Ltd., Tokyo (JP)

(72) Inventors: Yoshihiro Takahashi, Ibaraki (JP); Yasuo Kamigata, Ibaraki (JP); Hikari Murai, Ibaraki (JP); Masahiro Aoshima, Ibaraki (JP); Shinji Tsuchikawa, Ibaraki (JP); Masato Miyatake, Ibaraki (JP); Tomohiko Kotake, Ibaraki (JP); Hiroyuki Izumi, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/133,662

(22) Filed: Apr. 20, 2016

(65) Prior Publication Data

US 2016/0234942 A1   Aug. 11, 2016

Related U.S. Application Data

(62) Division of application No. 13/518,578, filed as application No. PCT/JP2010/073376 on Dec. 24, 2010.

(30) Foreign Application Priority Data

Dec. 25, 2009 (JP) ................................ 2009-296058
Jul. 15, 2010 (JP) ................................ 2010-160979
Jul. 23, 2010 (JP) ................................ 2010-165556

(51) Int. Cl.

| | | |
|---|---|---|
| *H05K 1/03* | (2006.01) | |
| *C09D 163/04* | (2006.01) | |
| *B32B 15/08* | (2006.01) | |
| *B32B 27/04* | (2006.01) | |
| *B32B 27/18* | (2006.01) | |
| *C08J 5/24* | (2006.01) | |
| *C08L 63/00* | (2006.01) | |
| *C08K 3/36* | (2006.01) | |
| *C08K 5/3415* | (2006.01) | |
| *C08K 3/22* | (2006.01) | |
| *C08K 3/34* | (2006.01) | |

(Continued)

(52) U.S. Cl.
CPC ............ *C09D 163/04* (2013.01); *B32B 15/08* (2013.01); *B32B 27/04* (2013.01); *B32B 27/18* (2013.01); *C08J 5/24* (2013.01); *C08K 3/013* (2018.01); *C08K 3/22* (2013.01); *C08K 3/34* (2013.01); *C08K 3/36* (2013.01); *C08K 5/3415* (2013.01); *C08K 13/02* (2013.01); *C08L 63/00* (2013.01); *C09D 7/61* (2018.01); *C09D 7/63* (2018.01); *C09D 163/00* (2013.01); *H05K 1/0306* (2013.01); *H05K 1/0373* (2013.01); *H05K 3/0047* (2013.01); *C08J 2300/24* (2013.01); *C08J 2363/00* (2013.01); *C08K 2003/2206* (2013.01); *C08K 2003/2227* (2013.01); *C08K 2003/2255* (2013.01); *C08K 2003/2296* (2013.01); *H05K 1/0366* (2013.01); *H05K 2201/0129* (2013.01); *H05K 2201/0209* (2013.01); *Y10T 156/10* (2015.01); *Y10T 428/31529* (2015.04); *Y10T 428/31678* (2015.04)

(58) Field of Classification Search
CPC ... C09D 163/04; H05K 1/0306; H05K 1/0373
See application file for complete search history.

(56) References Cited

U.S. PATENT DOCUMENTS

| | | |
|---|---|---|
| 4,298,720 A | 11/1981 | Yamazaki et al. |
| 6,291,556 B1 | 9/2001 | Osada et al. |

(Continued)

FOREIGN PATENT DOCUMENTS

| | | |
|---|---|---|
| EP | 2 025 696 | 2/2009 |
| EP | 2 412 743 | 2/2012 |

(Continued)

OTHER PUBLICATIONS

Office Action dated Aug. 24, 2016, for Korean Application No. 10-2012-7015701.

(Continued)

*Primary Examiner* — Seahvosh Nikmanesh
(74) *Attorney, Agent, or Firm* — Fitch, Even, Tabin & Flannery, L.L.P.

(57) ABSTRACT

Discloses are a thermosetting resin composition containing a maleimide compound including an unsaturated maleimide compound having a specified chemical structure, a thermosetting resin, an inorganic filler, and a molybdenum compound; a laminate plate for wiring boards obtained by coating a base material with a thermosetting resin composition containing a thermosetting resin, silica, and a specified molybdenum compound and then performing semi-curing to form a prepreg, and laminating and molding the prepreg; and a method for manufacturing a resin composition varnish including specified steps. According to the present invention, electronic components having low thermal expansion properties and excellent drilling processability and heat resistance, for example, a prepreg, a laminate plate, an interposer, etc., can be provided.

11 Claims, No Drawings

(51) Int. Cl.
*C08K 13/02* (2006.01)
*C09D 163/00* (2006.01)
*H05K 3/00* (2006.01)
*C09D 7/61* (2018.01)
*C09D 7/63* (2018.01)
*C08K 3/013* (2018.01)

(56) References Cited

U.S. PATENT DOCUMENTS

| | | | |
|---|---|---|---|
| 6,361,866 | B1 | 3/2002 | Ogima et al. |
| 2002/0143091 | A1 | 10/2002 | Gallo |
| 2004/0034161 | A1 | 2/2004 | Osada et al. |
| 2006/0008632 | A1 | 1/2006 | Oohori et al. |
| 2006/0089070 | A1* | 4/2006 | Gaku .............. B29C 70/00 442/232 |
| 2008/0093111 | A1* | 4/2008 | Tsurumi ............ H05K 3/387 174/257 |
| 2009/0017316 | A1 | 1/2009 | Kato et al. |
| 2010/0065315 | A1 | 3/2010 | Kimura |
| 2012/0009836 | A1* | 1/2012 | Ueno .............. B32B 15/08 442/59 |
| 2013/0096233 | A1 | 4/2013 | Iwami et al. |

FOREIGN PATENT DOCUMENTS

| | | |
|---|---|---|
| JP | 52-51499 | 4/1977 |
| JP | 57-38851 | 3/1982 |
| JP | 62-132915 | 6/1987 |
| JP | 62132915 A | 6/1987 |
| JP | 3-52773 | 3/1991 |
| JP | 2000-264986 | 9/2000 |
| JP | 2002-161151 | 6/2002 |
| JP | 2002-527538 | 8/2002 |
| JP | 2003-201332 | 7/2003 |
| JP | 2004-537629 | 12/2004 |
| JP | 2005-162787 | 6/2005 |
| JP | 4132703 | 6/2008 |
| JP | 2009-35728 A | 2/2009 |
| JP | 2009-138075 | 6/2009 |
| JP | 2009-155399 | 7/2009 |
| JP | 2009-206326 | 9/2009 |
| JP | 2009-206326 A | 9/2009 |
| JP | 2010-106150 | 5/2010 |
| KR | 10-2008-0014158 A | 2/2008 |
| KR | 10-2009-0014362 A | 2/2009 |
| TW | 538482 | 6/2003 |
| TW | 200718725 A | 5/2007 |
| TW | 200833755 | 8/2008 |
| WO | 00/21900 | 4/2000 |
| WO | 2011/118584 A1 | 9/2011 |

OTHER PUBLICATIONS

Office Action dated Dec. 17, 2015, for Taiwanese Application No. 104113804.

Office action dated Oct. 7, 2015, for Taiwanese Application No. 104113803, together with English language translation thereof.

Taiwanese Official Action dated Oct. 28, 2014, for TW Application No. 10321502650.

Extended European Search Report dated Mar. 13, 2014, which includes a Supplementary European Search Report and European Search Opinion.

Japanese Official Action dated Jan. 14, 2014, for JP Application No. 2010-160979.

Decision to Grant a Patent dated May 7, 2014 (drafted Apr. 23, 2014), for Japanese Application No. 2010-160979, together with English language translation thereof.

Notification of Reasons for Refusal drafted Jan. 7, 2014, for Japanese Application No. 2010-160979, together with English language translation thereof.

"Global Dossier—United States Patent and Trademark Office", JP 2010-160979.

* cited by examiner

THERMOSETTING RESIN COMPOSITION, METHOD FOR PRODUCING RESIN COMPOSITION VARNISH, PREPREG AND LAMINATE

CROSS-REFERENCE TO RELATED APPLICATIONS

This is a U.S. Divisional Application of U.S. application Ser. No. 13/518,578 filed Jun. 22, 2012, which is a U.S. national phase application filed under 35 U.S.C. § 371 of International Application No. PCT/JP2010/073376, filed Dec. 24, 2010, designating the United States, which claims priority from Japanese Patent Applications 2010-165556 filed Jul. 23, 2010, 2010-160979 filed Jul. 15, 2010, and 2009-296058 filed Dec. 25, 2009, the contents of each of which are hereby incorporated herein by reference in their entirety for all purposes.

TECHNICAL FIELD

The present invention relates to a thermosetting resin composition which is especially low in thermal expansion properties and excellent in drilling processability and heat resistance and which is suitably used for electronic components, etc.; a prepreg and a laminate plate each using the same; a laminate plate for wiring boards requiring a drilling processing treatment at a manufacturing stage for wiring board; a manufacturing method of a resin composition varnish; and a prepreg and a laminate plate fabricated utilizing the subject manufacturing method, each of which is suitable for semiconductor packages and printed wiring boards.

BACKGROUND ART

In a wiring board to be used for semiconductor packages (hereinafter referred to as "interposer"), it is general to perform a large number of drilling processing for interlayer connection of wirings. In consequence, a laminate plate for interposers is required to have high drilling processability.

Now, for a laminate plate for semiconductor packages, there have hitherto been used a lot of curable resin compositions composed of a bismaleimide compound and a cyanate resin (for example, Patent Document 1). This is because in view of the fact that the subject resin compositions are excellent in heat resistance, the resin compositions were suitable as a resin composition for the laminate plate for semiconductor packages, which is frequently exposed to high temperatures in a reflow step or the like at the time of mounting.

However, in recent years, requirements for thinning and weight reduction of electronic appliances are increased, and associated with rapid progress of thinning and high density of semiconductor packages, laminate plates for semiconductor packages have also been required to have higher characteristics other than heat resistance over broad regions.

Above all, in order to suppress an increase of a warp at the time of mounting to be caused due to thinning of a semiconductor package, it is strongly required to make a coefficient of thermal expansion of a laminate plate for semiconductor packages close to that of a silicon chip, namely to realize low thermal expansion.

While there are considered a variety of techniques for realizing low thermal expansion of the laminate plate, it is effective to allow a resin per se for laminate plates to realize low thermal expansion, or to fill an inorganic filler in a high density in a resin composition. For that reason, a novolak type cyanate resin is used, or a content of the inorganic filler is increased (for example, Patent Document 2).

But, the use of a cyanate resin or the filling of an inorganic filler in a high density involved such a problem that cutting properties of the resin composition are lowered, thereby significantly impairing drilling processability of a laminate plate using such a resin composition.

Then, there was made an attempt to prevent a lowering of the drilling processability by adding a plate-shaped filler such as burnt talc, etc. as an inorganic filler or reducing a content the inorganic filler (for example, Patent Document 3). However, there were such inconveniences that the effect for preventing a lowering of the drilling processability is insufficient; the resin composition becomes low in elasticity, so that the effect for suppressing a warp of the semiconductor package is insufficient; and so on. Thus, satisfactory results have not been obtained yet.

In order to realize low thermal expansion of the laminate plate, it is effective to increase a content of a filler having a small coefficient of thermal expansion, such as silica, among inorganic fillers in the resin composition used in the laminate plate. But, if the content of a hard filler such as silica is increased, there was encountered such a problem that the drilling processability of the laminate plate is lowered.

Also, in order to enhance the drilling processability, there is made an attempt to add a metal dichalcogenide such as molybdenum disulfide as an inorganic solid lubricant particle (see, for example, Patent Document 4). But, if molybdenum disulfide is added, there is encountered such a problem that electrical insulating properties of the laminate plate are significantly lowered. Thus, satisfactory results have not been obtained yet.

Then, in order to solve this problem, the present inventors investigated additives which even when an inorganic filler is filled in high density, can inhibit the deterioration of the drilling processability and then found that a molybdenum compound has an excellent effect.

But, since the molybdenum compound has a large specific gravity, when added directly to a resin composition varnish to be used for the fabrication of a laminate plate, it easily precipitates to cause defective manufacture. For that reason, it is recommended to use a particle having a molybdenum compound supported on talc or the like (for example, KEMIGARD 911C, manufactured by Sherwin-Williams Company) (see, for example, Patent Document 5). However, there are such drawbacks that the resin composition varnish is thickened; aggregation of the molybdenum compound-supported particles with each other easily occurs; and so on. Thus, satisfactory results are not obtained.

PRIOR ART DOCUMENTS

Patent Documents

Patent Document 1: JP-A-3-52773
Patent Document 2: Japanese Patent No. 4132703
Patent Document 3: JP-A-2005-162787
Patent Document 4: JP-T-2002-527538
Patent Document 5: JP-A-2000-264986

DISCLOSURE OF THE INVENTION

Under such circumstances, the present invention has been made. A first object of the present invention is to provide a thermoplastic resin composition which is especially low in thermal expansion properties and excellent in drilling processability and heat resistance and which is suitably used for electronic components, etc., and a prepreg and a laminate plate each using the same; and a second object thereof is to provide a laminate plate for wiring boards, which is very excellent in drilling processability at the time of fabricating a wiring board and which also has favorable electrical insulating properties and low thermal expansion properties.

Furthermore, a third object of the present invention is to provide a method for manufacturing a resin composition varnish, in which precipitation or aggregation of a molybdenum compound hardly occurs, and a prepreg and a laminate plate each having a low coefficient of thermal expansion and high drilling processability.

The present inventors made extensive and intensive investigations. As a result, it has been found that the foregoing first object can be achieved by a thermosetting resin composition containing an unsaturated maleimide compound having an acidic substituent composed of a specified chemical formula, a thermosetting resin, an inorganic filler, and a molybdenum compound; the foregoing second object can be achieved by forming a laminate plate by using a thermosetting resin composition containing a thermosetting resin, a specified amount of silica, and a specified molybdenum compound; and furthermore, the foregoing third object can be achieved by manufacturing a resin composition varnish by a method in which after a molybdenum compound is dispersed and mixed in a slurry having a specified silica particle dispersed therein, this slurry is added to a varnish containing a thermosetting resin, and thereafter, an inorganic filler is blended therewith. The present invention has been accomplished on the basis of such knowledge.

That is, the present invention provides the following.

(1) A thermosetting resin composition comprising (A) a maleimide compound containing an unsaturated maleimide compound having an acidic substituent, as represented by the following general formula (I) or (II), (B) a thermosetting resin, (C) an inorganic filler, and (D) a molybdenum compound:

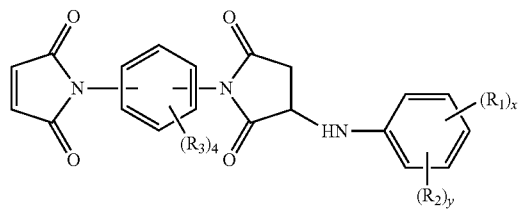

(I)

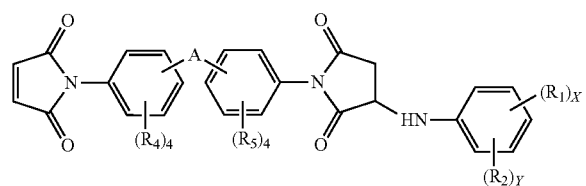

(II)

(In the formulae, $R_1$ represents a hydroxyl group, a carboxyl group, or a sulfonic acid group, each of which is the acidic substituent; each of $R_2$, $R_3$, $R_4$, and $R_5$ independently represents a hydrogen atom, an aliphatic hydrocarbon group having a carbon number of from 1 to 5, or a halogen atom; A represents an alkylene group, an alkylidene group, an ether group, a sulfonyl group, or a group represented by the following formula (III); x represents an integer of from 1 to 5; y represents an integer of from 0 to 4; and a sum of x and y is 5.)

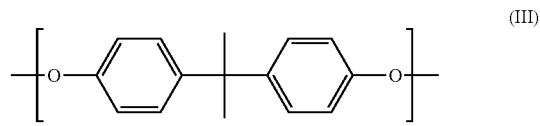

(III)

(2) The thermosetting resin composition as set forth above in (1), wherein the molybdenum compound (D) is at least one member selected from a molybdenum oxide and a molybdic acid compound, and a content of the molybdenum compound is from 0.02 to 20% by volume of the whole of the resin composition.

(3) The thermosetting resin composition as set forth above in (1) or (2), wherein the thermosetting resin (B) is an epoxy resin; a total sum content of the component (A) and the component (B) is from 30 to 80% by volume of the whole of the resin composition; and a mass ratio of the component (A) and the component (B) is from 20 to 90 parts by mass in terms of the component (A) based on 100 parts by mass of the total sum content of the component (A) and the component (B).

(4) The thermosetting resin composition as set forth above in any one of (1) to (3), wherein the inorganic filler (C) is fused spherical silica, and a content of the inorganic filler is from 10 to 60% by volume of the whole of the resin composition.

(5) A prepreg obtained by impregnating or coating a base material with the thermosetting resin composition asset forth above in any one of (1) to (4) and then performing B-staging.

(6) A laminate plate obtained by laminating and molding the prepreg as set forth above in (5).

(7) The laminate plate as set forth above in (6), which is a metal clad laminate plate obtained by superimposing a metal foil on at least one surface of the prepreg and then performing heat pressure molding.

(8) A laminate plate for wiring boards, obtained by coating a thermosetting resin composition containing (E) a thermosetting resin, (F) silica, and (G) at least one molybdenum compound selected from zinc molybdate, calcium molybdate, and magnesium molybdate, with a content of the silica (F) being 20% by volume or more and not more than 60% by volume, on a base material in a film form or fiber form, then performing semi-curing to form a prepreg, and laminating and molding the prepreg.

(9) The laminate plate for wiring boards as set forth above in (8), wherein the silica (F) is fused spherical silica having an average particle size of 0.1 μm or more and not more than 1 μm, and a content of the molybdenum compound (G) is from 0.1% by volume or more and not more than 10% by volume of the whole of the resin composition.

(10) The laminate plate for wiring boards as set forth above in (8) or (9), wherein the thermosetting resin composition is varnished.

(11) The laminate plate for wiring boards as set forth above in any one of (8) to (10), wherein the base material in a film form or fiber form is a glass cloth.

(12) A method for manufacturing a resin composition varnish comprising a first dispersing and mixing step of dispersing and mixing (I) a molybdenum compound in (H) a slurry containing a silica particle having an average particle size of 0.01 μm or more and not more than 0.1 μm and a specific surface area of 30 m²/g or more and not more than 270 m²/g, a second dispersing and mixing step of dispersing and mixing the slurry having gone through the first dispersing and mixing step in a varnish containing (J) a thermosetting resin, and a third dispersing and mixing step of dispersing and mixing (K) an inorganic filler exclusive of the silica particle and the molybdenum compound in the varnish having gone through the second dispersing and mixing step.

(13) The method for manufacturing a resin composition varnish as set forth above in (12), further comprising a curing accelerator adding step of adding a curing accelerator to the varnish after the third dispersing and mixing step.

(14) The method for manufacturing a resin composition varnish as set forth above in (12) or (13), wherein the molybdenum compound (I) is one member or a mixture of two or more members selected from the group consisting of zinc molybdate, calcium molybdate, and magnesium molybdate.

(15) A prepreg comprising a base material impregnated and coated with a resin composition varnish obtained through a first dispersing and mixing step of dispersing and mixing (I) a molybdenum compound in (H) a slurry containing a silica particle having an average particle size of 0.01 μm or more and not more than 0.1 μm and a specific surface area of 30 m²/g or more and not more than 270 m²/g; a second dispersing and mixing step of dispersing and mixing the slurry having gone through the first dispersing and mixing step in a varnish containing (J) a thermosetting resin; and a third dispersing and mixing step of dispersing and mixing (K) an inorganic filler in the varnish having gone through the second dispersing and mixing step.

(16) A laminate plate obtained by laminating and molding the prepreg as set forth in (15).

The thermosetting resin composition of the present invention is especially low in thermal expansion properties and excellent in drilling processability and heat resistance and is suitably used for electronic components, etc.

For that reason, according to the present invention, a prepreg and a laminate plate each having an excellent performance, and so on can be provided by using the subject thermosetting resin composition.

Also, according to the present invention, a laminate plate for wiring boards, which is very excellent in drilling processability at the time of fabricating a wiring board and which also has favorable electrical insulating properties and low thermal expansion properties, can be provided. In consequence, when an interposer is manufactured by using the laminate plate for wiring boards of the present invention, a semi-conductor package which is less in a warp at low costs can be obtained.

Furthermore, according to the present invention, a method for manufacturing a resin composition varnish, in which precipitation or aggregation of a molybdenum compound hardly occurs, and a prepreg and a laminate plate each having a low coefficient of thermal expansion and high drilling processability can be provided.

MODES FOR CARRYING OUT THE INVENTION

First of all, the thermosetting resin composition of the present invention is described.

[Thermosetting Resin Composition]

The thermosetting resin composition of the present invention is a resin composition containing, as essential components, (A) a maleimide compound containing an unsaturated maleimide compound having an acidic substituent, as represented by the following general formula (I) or (II), (B) a thermosetting resin, (C) an inorganic filler, and (D) a molybdenum compound.

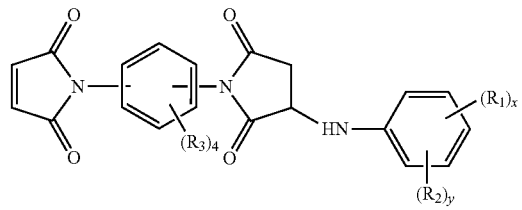

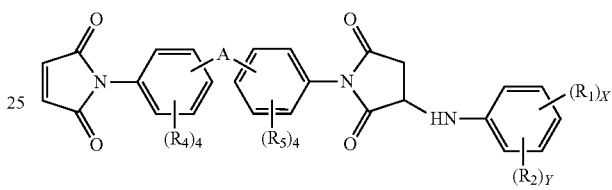

In the formulae, $R_1$ represents a hydroxyl group, a carboxyl group, or a sulfonic acid group, each of which is the acidic substituent; each of $R_2$, $R_3$, $R_4$, and $R_5$ independently represents a hydrogen atom, an aliphatic hydrocarbon group having a carbon number of from 1 to 5, or a halogen atom, $R_2$ to $R_5$ may be the same as or different from each other; A represents an alkylene group, an alkylidene group, an ether group, a sulfonyl group, or a group represented by the following formula (III); x represents an integer of from 1 to 5; y represents an integer of from 0 to 4; and a sum of x and y is 5.

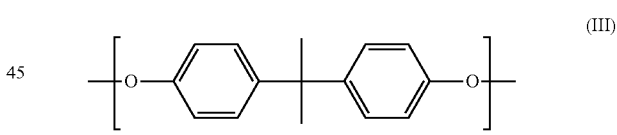

First of all, the unsaturated maleimide compound having an acidic substituent, as represented by the general formula (I) or (II), which is the component (A), can be, for example, manufactured by allowing a maleimide compound having at least two N-substituted maleimide groups in one molecule thereof and an amine compound having an acidic substituent represented by the following general formula (IV) to react with each other in an organic solvent.

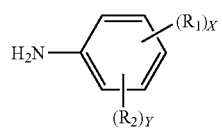

In the formula, each $R_1$ independently represents a hydroxyl group, a carboxyl group, or a sulfonic acid group, which is the acidic substituent; each $R_2$ independently represents a hydrogen atom, an aliphatic hydrocarbon group having a carbon number of from 1 to 5, or a halogen atom; x represents an integer of from 1 to 5; y represents an integer of from 0 to 4; and a sum of x and y is 5.

Examples of the maleimide compound having at least two N-substituted maleimide groups in one molecule thereof include bis(4-maleimidophenyl)methane, bis(4-maleimidophenyl)ether, bis(4-maleimidophenyl)sulfone, 3,3-dimethyl-5,5-diethyl-4,4-diphenylmethane bismaleimide, 4-methyl-1,3-phenylene bismaleimide, m-phenylene bismaleimide, 2,2-bis-(4-(4-maleimidophenoxy)phenyl)propane, and so on.

Of these, bis(4-maleimidophenyl)methane, m-phenylene bismaleimide, and bis(4-maleimidophenyl)sulfone are preferable because these compounds have high reactivity and are able to realize higher heat resistance; m-phenylene bismaleimide and bis(4-maleimidophenyl)methane are more preferable from the standpoint of inexpensiveness; and bis(4-maleimidephenyl)methane is especially preferable from the standpoint of solubility in a solvent.

Examples of the amine compound having an acidic substituent represented by the general formula (IV) include m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, 3,5-dicarboxyaniline, and so on. Of these, m-aminophenol, p-aminophenol, p-aminobenzoic acid, m-aminobenzoic acid, and 3,5-dihydroxyaniline are preferable from the standpoints of solubility and synthetic yield; and m-aminophenol and p-aminophenol are more preferable from the standpoint of heat resistance.

Though the organic solvent which is used for this reaction is not particularly limited, examples thereof include an alcohol based solvent such as ethanol, propanol, butanol, methyl cellosolve, butyl cellosolve, propylene glycol monomethyl ether, etc.; a ketone based solvent such as acetone, methyl ethyl ketone, methyl isobutyl ketone, cyclohexanone, etc.; an ether based solvent such as tetrahydrofuran, etc.; an aromatic solvent such as toluene, xylene, mesitylene, etc.; a nitrogen atom-containing solvent such as dimethylformamide, dimethylacetamide, N-methylpyrrolidone, etc.; a sulfur atom-containing solvent such as dimethyl sulfoxide, etc.; and so on. These can be used singly or in admixture of two or more kinds thereof.

Of these organic solvents, cyclohexanone, propylene glycol monomethyl ether, and methyl cellosolve are preferable from the standpoint of solubility; cyclohexanone and propylene glycol monomethyl ether are more preferable from the standpoint of low toxicity; and propylene glycol monomethyl ether is especially preferable in view of the fact that it is high in the volatility and hardly remains as a residual solvent at the time of manufacturing a prepreg.

A use amount of the organic solvent is preferably from 10 to 1,000 parts by mass, more preferably from 100 to 500 parts by mass, and especially preferably from 200 to 500 parts by mass based on 100 parts by mass of a total sum of the maleimide compound having at least two N-substituted maleimide groups in one molecule thereof and the amine compound having an acidic substituent represented by the general formula (IV).

When the use amount of the organic solvent is 10 parts by mass or more, the solubility is sufficient, whereas when it is not more than 1,000 parts by mass, the reaction time is not excessively long.

As for use amounts of the maleimide compound having at least two N-substituted maleimide groups in one molecule thereof and the amine compound having an acidic substituent represented by the general formula (IV), an equivalent ratio of a maleimide group equivalent of the maleimide compound and an equivalent of the amine compound as reduced into an $—NH_2$ group is preferably in the range represented by the following expression.

$$1.0 < (\text{Maleimide group equivalent})/(\text{Equivalent as reduced into an —NH}_2 \text{ group}) \leq 10.0$$

The subject equivalent ratio is more preferably in the range of from 2.0 to 10.0. By allowing the subject equivalent ratio to fall within the foregoing range, the solubility in a solvent does not become insufficient, the gelation is not caused, and the heat resistance of the thermosetting resin is not lowered.

Also, preferably, a reaction temperature is in the range of from 50 to 200° C., and a reaction time is in the range of from 0.1 to 10 hours; and more preferably, the reaction temperature is in the range of from 100 to 160° C., and the reaction time is in the range of from 1 to 8 hours.

Incidentally, a reaction accelerator can be used in this reaction, as the need arises. Examples of the reaction accelerator include an amine such as triethylamine, pyridine, tributylamine, etc.; an imidazole such as methyl imidazole, phenyl imidazole, etc.; and an organic phosphorus based compound such as triphenyl phosphine, etc. These can be used singly or in admixture of two or more kinds thereof.

By allowing the thermosetting resin composition of the present invention to contain the unsaturated maleimide compound having an acidic substituent represented by the foregoing general formula (I) or (II) as the component (A), low thermal expansion properties and excellent heat resistance are revealed. Though the component (A) may contain other maleimide compound, it is preferable that the component (A) contains 60% by mass or more of the unsaturated maleimide compound having an acidic substituent represented by the general formula (I) or (II).

Examples of the thermosetting resin as the component (B) include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, a melamine resin, and so on. These can be used singly or in admixture of two or more kinds thereof.

Of these, an epoxy resin is preferable from the standpoints of moldability and electrical insulating properties. Examples of such an epoxy resin include a bisphenol A type epoxy resin, a bisphenol F type epoxy resin, a bisphenol S type epoxy resin, a phenol novolak type epoxy resin, a cresol novolak type epoxy resin, a bisphenol A novolak type epoxy resin, a bisphenol F novolak type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a diglycidyl ether compound of a polyfunctional phenol or a polycyclic aromatic compound such as anthracene, etc., and so on. These can be used singly or in admixture of two or more kinds thereof.

In the case of using an epoxy resin as the thermosetting resin, a curing agent or a curing accelerator of the epoxy resin can be used, as the need arises. Examples of the curing agent include a polyfunctional phenol compound such as phenol novolak, cresol novolak, etc.; an amine compound such as dicyandiamide, diaminodiphenylmethane, diaminodiphenylsulfone, etc.; an acid anhydride such as phthalic anhydride, pyromellitic anhydride, maleic anhydride, a maleic anhydride copolymer, etc.; and so on. These can be used singly or in admixture of two or more kinds thereof.

Also, examples of the curing accelerator include an imidazole and a derivative thereof, an organic phosphorus based compound, a secondary amine, a tertiary amine, a quaternary ammonium salt, and so on. These can be used singly or in admixture of two or more kinds thereof.

As for contents of the component (A) and the component (B), a total sum content of the component (A) and the component (B) is preferably from 30 to 80% by volume, and more preferably from 40 to 70% by volume of the whole of the resin composition. By allowing the total sum content of the component (A) and the component (B) to fall within the range of from 30 to 80% by volume, the moldability and low thermal expansion properties of the resin composition can be kept favorable.

Also, a mass ratio of the component (A) and the component (B) is preferably from 20 to 90 parts by mass, and more preferably from 30 to 80 parts by mass in terms of the component (A) based on 100 parts by mass of the total sum content of the component (A) and the component (B). By allowing the content of the component (A) to fall within the range of from 20 to 90 parts by mass, the incombustibility, adhesion, and heat resistance of the resin composition can be kept favorable.

Examples of the inorganic filler as the component (C) include silica, alumina, talc, mica, kaolin, aluminum hydroxide, magnesium hydroxide, zinc borate, zinc stannate, zinc oxide, titanium oxide, boron nitride, calcium carbonate, barium sulfate, aluminum borate, potassium titanate, a glass powder of E-glass, S-glass, D-glass, etc., a hollow glass bead, and so on. These can be used singly or in admixture of two or more kinds thereof.

Of these, silica is preferable from the standpoint of low thermal expansion properties. Examples of the silica include precipitated silica which is manufactured by a wet process and which has a high water content; and dry process silica which is manufactured by a dry process and which does not substantially contain bonding water, etc. Furthermore, the dry process silica includes crushed silica, fumed silica, and fused spherical silica depending upon a difference of the manufacturing method. Of these, from the standpoints of low thermal expansion properties and high fluidity upon being filled in the resin, fused spherical silica is preferable.

In the case of using fused spherical silica as the inorganic filler as the component (C), its average particle size is preferably from 0.1 to 10 µm, and more preferably from 0.3 to 8 µm.

When the average particle size of the fused spherical silica is controlled to 0.1 µm or more, the fluidity at the time of filling the fused spherical silica in a high density in the resin composition can be kept favorable, whereas when it is controlled to not more than 10 µm, a probability of incorporation of coarse particles is reduced, thereby enabling one to suppress the generation of failure to be caused due to the coarse particles.

When a cumulative distribution curve by particle size is determined while defining the whole volume of the particles as 100%, the average particle size as referred to herein means a particle size corresponding to just 50% of the volume, and it can be measured by a particle size distribution analyzer adopting a laser diffraction scattering method, or the like.

A content of the inorganic filler as the component (C) is preferably from 10 to 60% by volume, and more preferably from 20 to 50% by volume of the whole of the resin composition. By allowing the content of the inorganic filler to fall within the range of from 10 to 60% by volume of the whole of the resin composition, the moldability and low thermal expansion properties of the resin composition can be kept favorable.

Examples of the molybdenum compound as the component (D) include a molybdenum oxide and a molybdic acid compound such as molybdenum trioxide, zinc molybdate, ammonium molybdate, magnesium molybdate, calcium molybdate, barium molybdate, sodium molybdate, potassium molybdate, phosphomolybdic acid, ammonium phosphomolybdate, sodium phosphomolybdate, silicomolybdic acid, etc.; and an inorganic molybdenum compound such as molybdenum boride, molybdenum disilicate, molybdenum nitride, molybdenum carbide, etc. These can be used singly or in admixture of two or more kinds thereof.

Of these, a molybdenum oxide and a molybdic acid compound are preferable from the standpoint that the effect for preventing a lowering of the drilling processability is favorable; and furthermore, zinc molybdate, calcium molybdate, and magnesium molybdate are especially preferable from the standpoints of low water solubility and toxicity and high electrical insulating properties.

In the case where zinc molybdate, calcium molybdate, or magnesium molybdate is used as the component (D), by supporting such a molybdenum compound on talc, silica, zinc oxide, calcium carbonate, magnesium hydroxide, or the like and using it, it is possible to contrive to prevent precipitation and enhance dispersibility at the time of dissolving the resin composition in an organic solvent to form a varnish. Examples of such a molybdenum compound include KEMGARD 911C, manufactured by Sherwin-Williams Company, which is one having zinc molybdate supported on talc.

A content of the molybdenum compound as the component (D) is preferably from 0.02 to 20% by volume, and more preferably from 0.1 to 15% by volume of the whole of the resin composition. By allowing the content of the molybdenum compound to fall within the range of from 0.02 to 20% by volume of the whole of the resin composition, not only the adhesion of the resin composition can be kept favorable, but the effect for preventing a lowering of the drilling processability can be sufficiently obtained.

Furthermore, the thermosetting resin composition of the present invention can arbitrarily contain known thermoplastic resin, elastomer, organic filler, flame retarder, ultraviolet ray absorber, antioxidant, and adhesion enhancer, and the like to an extent such that thermosetting properties as the resin composition are not impaired.

Examples of the thermoplastic resin include polyethylene, polypropylene, polystyrene, a polyphenylene ether resin, a phenoxy resin, a polycarbonate resin, a polyester resin, a polyamide resin, a polyamide-imide resin, a polyimide resin, a xylene resin, a polyphenylene sulfide resin, a polyether imide resin, a polyetheretherketone resin, a polyether imide resin, a silicone resin, a tetrafluoroethylene resin, and so on.

Examples of the elastomer include polybutadiene, polyacrylonitrile, epoxy-modified polybutadiene, maleic anhydride-modified polybutadiene, phenol-modified polybutadiene, carboxy-modified polyacrylonitrile, and so on.

Examples of the organic filler include a resin filler having a homogeneous structure, which is composed of polyethylene, polypropylene, polystyrene, a polyphenylene ether resin, a silicone resin, a tetrafluoroethylene resin, or the like; a resin filler of a core-shell structure having a core layer in a rubber state, which is composed of an acrylic acid ester based resin, a methacrylic acid ester based resin, a conjugated diene based resin, or the like, and a shell layer in a vitreous state, which is composed of an acrylic acid ester based resin, a methacrylic acid ester based resin, an aromatic vinyl based resin, a vinyl cyanide based resin, or the like; and so on.

Examples of the flame retarder include a halogen-containing flame retarder containing bromine or chlorine; a phosphorus based flame retarder such as triphenyl phosphate, tricresyl phosphate, trisdichloropropyl phosphate, red phosphorus, etc.; a nitrogen based flame retarder such as guanidine sulfamate, melamine sulfate, melamine polyphosphate, melamine cyanurate, etc.; a phosphazene based flame retarder such as cyclophosphazene, polyphosphazene, etc.; an inorganic flame retarder such as antimony trioxide, etc.; and so on.

Examples of the ultraviolet ray absorber include a benzotriazole based ultraviolet ray absorber and so on.

Examples of the antioxidant include a hindered phenol based or hindered amine based antioxidant. Examples of the adhesion enhancer include a coupling agent such as a silane series, a titanate series, an aluminate series, etc.; and so on.

The thermosetting resin composition of the present invention is impregnated into or coated on a base material, subsequently subjected to B-staging, and then used as a prepreg. At the time of use for the prepreg, it is preferable to render the thermosetting resin composition in a state of a varnish in which the respective components are finally dissolved or dispersed in an organic solvent.

Examples of the organic solvent which is used on that occasion include an alcohol based solvent such as methanol, ethanol, propanol, butanol, methyl cellosolve, butyl cellosolve, propylene glycol monomethyl ether, etc.; a ketone based solvent such as acetone, methyl ethyl ketone, methyl isobutyl ketone, cyclohexanone, etc.; an ester based solvent such as butyl acetate, propylene glycol monomethyl ether acetate, etc.; an ether based solvent such as tetrahydrofuran, etc.; an aromatic solvent such as toluene, xylene, mesitylene, etc.; a nitrogen atom-containing solvent such as dimethylformamide, dimethylacetamide, N-methylpyrrolidone, etc.; a sulfur atom-containing solvent such as dimethyl sulfoxide, etc.; and so on. These can be used singly or in admixture of two or more kinds thereof.

Of these, from the standpoint of solubility, methyl ethyl ketone, methyl isobutyl ketone, cyclohexanone, methyl cellosolve, and propylene glycol monomethyl ether are preferable; and from the standpoint of low toxicity, methyl isobutyl ketone, cyclohexanone, and propylene glycol monomethyl ether are more preferable.

Also, at the time of blending in the varnish, it is preferable to subject the inorganic filler to a pre-treatment with a surface treating agent such as a coupling agent, e.g., a silane series, a titanate series, etc., a silicone oligomer, or the like, or to an integral blend treatment.

A content of the resin composition in the finally obtained varnish is preferably from 40 to 90% by mass, and more preferably from 50 to 80% by mass of the whole of the varnish. By allowing the content of the resin composition in the varnish to fall within the range of from 40 to 90% by mass, the coating properties can be kept favorable, and a prepreg having an appropriate attachment amount of the resin composition can be obtained.

The prepreg of the present invention is one obtained by impregnating or coating a base material with the thermosetting resin composition of the present invention and then performing B-staging. That is, the prepreg of the present invention is manufactured by impregnating or coating a base material with the thermosetting resin composition of the present invention and then performing semi-curing (B-staging) by heating or the like. The prepreg of the present invention is hereunder described in detail.

For the base material which is used for the prepreg of the present invention, well-known materials which are used for various laminate plates for electrical insulating materials can be used. Examples of the material include fibers of an inorganic material such as E-glass, D-glass, S-glass, Q-glass, etc.; fibers of an organic material such as aramid, polyester, polytetrafluoroethylene, etc.; mixtures thereof; and so on.

Though such a base material has a form of, for example, a woven fabric, a nonwoven fabric, a roving, a chopped strand mat, a surfacing mat, etc., the material and the shape are selected depending on an application or a performance of the target molded article, and the material and the shape can be employed solely or in combination of two or more kinds thereof, as the need arises.

Though the base material is not particularly limited with respect to its thickness, for example, those having a thickness of from about 0.01 to 0.2 mm can be used. Those having been subjected to a surface treatment with a silane coupling agent, etc., or those having been subjected to a mechanical opening treatment are suitable from the standpoints of heat resistance, moisture resistance, and processability. The prepreg of the present invention can be obtained by impregnating or coating the base material with the resin composition in such a manner that an attachment amount thereof relative to the base material is from 20 to 90% by mass in terms of a resin content of the prepreg after drying, and then heating for drying usually at a temperature of from 100 to 200° C. for from 1 to 30 minutes to achieve semi-curing (B-staging).

The laminate plate of the present invention is one obtained by laminating and molding the prepreg of the present invention. That is, the laminate plate is, for example, one obtained by lamination and molding in a configuration in which from 1 to 20 sheets of the prepreg of the present invention are superimposed, and a metal foil such as copper, aluminum, etc. is disposed on one surface or both surfaces thereof. As for a molding condition, for example, techniques for a laminate plate or multi-layered board for electrical insulating materials can be applied. The molding can be performed within the range at a temperature of from 100 to 250° C. under a pressure of from 0.2 to 10 MPa for a heating time of from 0.1 to 5 hours by using, for example, a multi-stage press, a multi-stage vacuum press, a continuous molding machine, an autoclave molding machine, etc. Also, a multi-layered board can be manufactured by combining the prepreg of the present invention with a wiring board for internal layer and laminating and molding the combination.

Next, the laminate plate for wiring boards of the present invention is described.

[Laminate Plate for Wiring Boards]

The laminate plate for wiring boards of the present invention is one obtained by coating a thermosetting resin composition containing (E) a thermosetting resin, (F) silica, and (G) at least one molybdenum compound selected from zinc molybdate, calcium molybdate, and magnesium molybdate, with a content of the silica (F) being 20% by volume or more and not more than 60% by volume, on a base material in a film form or fiber form and then performing semi-curing to form a prepreg, and laminating and molding the prepreg.

Of these, examples of the thermosetting resin as the component (E) include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, a melamine resin, and so on. These can be used singly or in admixture of two or more kinds thereof.

Of these, from the standpoints of moldability and electrical insulating properties, it is preferable to use the epoxy resin alone or in admixture.

Examples of the epoxy resin which is used include a bisphenol A type epoxy resin, a bisphenol F type epoxy resin, a bisphenol S type epoxy resin, a phenol novolak type epoxy resin, a cresol novolak type epoxy resin, a bisphenol A novolak type epoxy resin, a bisphenol F novolak type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a diglycidyl ether compound of a polyfunctional phenol or a polycyclic aromatic compound such as anthracene, etc., and so on. These can be used singly or in admixture of two or more kinds thereof.

In the case of using an epoxy resin as the thermosetting resin, a curing agent or a curing accelerator of the epoxy resin can be used, as the need arises.

Examples of the curing agent include a polyfunctional phenol compound such as phenol novolak, cresol novolak, etc.; an amine compound such as dicyandiamide, diaminodiphenylmethane, diaminodiphenylsulfone, etc.; an acid anhydride such as phthalic anhydride, pyromellitic anhydride, maleic anhydride, a maleic anhydride copolymer, etc.; and so on. These can be used singly or in admixture of two or more kinds thereof.

Also, examples of the curing accelerator include an imidazole and a derivative thereof, an organic phosphorus based compound, a secondary amine, a tertiary amine, a quaternary ammonium salt, and so on. These can be used singly or in admixture of two or more kinds thereof.

Examples of the silica as the component (F) include precipitated silica which is manufactured by a wet process and which has a high water content; and dry process silica which is manufactured by a dry process and which does not substantially contain bonding water, etc. The dry process silica includes crushed silica, fumed silica, and fused spherical silica depending upon a difference of the manufacturing method. Of these, from the standpoints of low thermal expansion properties and high fluidity upon being blended in the resin, fused spherical silica is preferable.

In the case of using fused spherical silica as the silica, its average particle size is preferably from 0.1 µm or more and not more than 1 µm. When the average particle size of the fused spherical silica is controlled to 0.1 µm or more, the fluidity at the time of blending in the resin can be kept favorable, whereas when it is controlled to not more than 1 µm, the wear of a drill blade at the time of drilling processing can be suppressed.

When a cumulative distribution curve by particle size is determined while defining the whole volume of the particles as 100%, the "average particle size" as referred to in this specification means a particle size corresponding to just 50% of the volume, and it can be measured by a particle size distribution analyzer adopting a laser diffraction scattering method, or the like.

It is necessary that a content of the silica is 20% by volume or more and not more than 60% by volume of the whole of the resin composition. When the content of the silica is controlled to 20% by volume or more of the whole of the resin composition, low thermal expansion of the laminate plate can be realized, whereas when it is controlled to not more than 60% by volume, the moldability and drilling processability can be kept favorable. The content of the silica is preferably 30% by volume or more and not more than 60% by volume, and more preferably 40% by volume or more and not more than 56% by volume.

It is necessary to use, as the component (G), at least one molybdenum compound selected from zinc molybdate, calcium molybdate, and magnesium molybdate.

At the time of using such a molybdenum compound together with the silica for a laminate plate, the effect for preventing a lowering of the drilling processability is larger than that in burnt talc or the like, and the electrical insulating properties are not significantly lowered unlikely those in molybdenum disulfide. At the time of blending such a molybdenum compound, a particle thereof may be used as it is, or such a molybdenum compound may be used upon being supported on a particle of talc, silica, zinc oxide, calcium carbonate, magnesium hydroxide, or the like. On that occasion, an average particle size of such a particle is preferably 0.3 µm or more and not more than 3 µm, and more preferably 0.5 µm or more and not more than 2 µm.

When the average particle size is controlled to 0.3 µm or more, the dispersibility at the time of blending in the resin can be kept favorable, whereas when it is controlled to not more than 3 µm, the abrupt precipitation in the case of dissolving the resin composition in an organic solvent to form a varnish can be prevented from occurring.

A content of the molybdenum compound is preferably 0.1% by volume or more and not more than 10% by volume, and more preferably 0.2% by volume or more and not more than 7% by volume of the whole of the resin composition.

When the content of the molybdenum compound is controlled to 0.1% by volume or more, the drilling processability of a laminate plate can be kept favorable, whereas when it is controlled to not more than 10% by volume, a lowering of the moldability can be prevented from occurring.

In the thermosetting resin composition according to the present invention, in addition to the foregoing, known thermoplastic resin, elastomer, inorganic filler, organic filler, flame retarder, ultraviolet ray absorber, antioxidant, and adhesion enhancer, and the like can be arbitrarily used.

Examples of such a thermoplastic resin include polyethylene, polypropylene, polystyrene, a polyphenylene ether resin, a phenoxy resin, a polycarbonate resin, a polyester resin, a polyamide resin, a polyamide-imide resin, a polyimide resin, a xylene resin, a polyphenylene sulfide resin, a polyether imide resin, a polyetheretherketone resin, a polyether imide resin, a silicone resin, a tetrafluoroethylene resin, and so on.

Examples of the elastomer include polybutadiene, acrylonitrile, epoxy-modified polybutadiene, maleic anhydride-modified polybutadiene, phenol-modified polybutadiene, carboxy-modified acrylonitrile, and so on.

Examples of the inorganic filler include alumina, talc, mica, kaolin, aluminum hydroxide, magnesium hydroxide, zinc borate, zinc stannate, zinc oxide, titanium oxide, boron nitride, calcium carbonate, barium sulfate, aluminum borate, potassium titanate, a glass powder of E-glass, S-glass, D-glass, etc., a hollow glass bead, and so on.

Examples of the organic filler include a resin particle having a homogeneous structure, which is composed of polyethylene, polypropylene, polystyrene, a polyphenylene ether resin, a silicone resin, a tetrafluoroethylene resin, or the like; a resin particle of a core-shell structure having a core layer in a rubber state, which is composed of an acrylic acid ester based resin, a methacrylic acid ester based resin, a conjugated diene based resin, or the like, and a shell layer in a vitreous state, which is composed of an acrylic acid ester based resin, a methacrylic acid ester based resin, an aromatic vinyl based resin, a vinyl cyanide based resin, or the like; and so on.

Examples of the flame retarder include a halogen-containing flame retarder containing bromine or chlorine; a phosphorus based flame retarder such as triphenyl phosphate, tricresyl phosphate, trisdichloropropyl phosphate, red phosphorus, etc.; a nitrogen based flame retarder such as guanidine sulfamate, melamine sulfate, melamine polyphosphate, melamine cyanurate, etc.; a phosphazene based flame retarder such as cyclophosphazene, polyphosphazene, etc.; an inorganic flame retarder such as antimony trioxide, etc.; and so on.

Examples of the ultraviolet ray absorber include a benzotriazole based ultraviolet ray absorber and so on; examples of the antioxidant include a hindered phenol based or hindered amine based antioxidant; and examples of the adhesion enhancer include a coupling agent such as a silane series, a titanate series, and an aluminate series, and so on.

The laminate plate for wiring boards of the present invention can be obtained by laminating and molding a material obtained by coating the thermoplastic resin composition using the foregoing components according to the present invention on a base material in a film form or fiber form, followed by semi-curing. At the time of coating the thermosetting resin composition according to the present invention, it is preferable to use the subject thermosetting resin composition after being dissolved in an organic solvent to form a varnish. By coating the resin composition after being varnished, a laminate plate which is homogenous and less in a defect such as a void, etc. can be obtained.

Examples of the organic solvent which is used at the time of varnishing the thermosetting resin composition include an alcohol based solvent such as methanol, ethanol, propanol, butanol, methyl cellosolve, butyl cellosolve, propylene glycol monomethyl ether, etc.; a ketone based solvent such as acetone, methyl ethyl ketone, methyl isobutyl ketone, cyclohexanone, etc.; an ester based solvent such as butyl acetate, propylene glycol monomethyl ether acetate, etc.; an ether based solvent such as tetrahydrofuran, etc.; an aromatic solvent such as toluene, xylene, mesitylene, etc.; a nitrogen atom-containing solvent such as dimethylformamide, dimethylacetamide, N-methylpyrrolidone, etc.; a sulfur atom-containing solvent such as dimethyl sulfoxide, etc.; and so on. These can be used singly or in admixture of two or more kinds thereof.

Of these, from the standpoint of solubility of the resin, methyl cellosolve, propylene glycol monomethyl ether, methyl ethyl ketone, methyl isobutyl ketone, and cyclohexanone are preferable; and from the standpoint of low toxicity, propylene glycol monomethyl ether, methyl isobutyl ketone, and cyclohexanone are more preferable.

A proportion of the resin composition in the varnish is preferably 50% by mass or more and not more than 80% by mass of the whole of the varnish. By allowing the proportion of the resin composition in the varnish to fall within the range of 50% by mass or more and not more than 80% by mass, the coating properties on the base material can be kept favorable.

As for the base material which is used at the time of coating, examples of the base material in a film form include a metal foil made of copper, aluminum, etc.; and an organic film made of polyethylene terephthalate, polyimide, etc. Examples of the base material in a fiber form include fibers of an inorganic material such as E-glass, D-glass, S-glass, Q-glass, etc.; fibers of an organic material such as aramid, polyester, polytetrafluoroethylene, etc.; and mixtures thereof such as a woven fabric, a nonwoven fabric, a roving mat, a chopped strand mat, and a surfacing mat.

Above all, it is preferable to use a woven fabric of fibers of an inorganic material such as E-glass, S-glass, D-glass, Q-glass, etc., namely a glass cloth. By using a glass cloth as the base material, it is possible to satisfy both low thermal expansion and high drilling processability of the laminate plate.

In the case of using a glass cloth as the base material, those having been subjected to a mechanical opening treatment, or those having been subjected to a surface treatment with a coupling agent, etc. can be used in a thickness of from 0.01 mm to 0.2 mm.

In order to obtain a prepreg by coating a thermoplastic resin composition varnish on a glass cloth and semi-curing it, for example, there can be adopted a method in which after the glass cloth is dipped in the resin composition varnish to impregnate the varnish therein, an attachment amount of the varnish is adjusted using a cut bar, a squeeze roll, or the like such that a proportion of the resin composition in the prepreg is from 20% by mass to 90% by mass, and the resultant is subsequently allowed to pass through a drying furnace at from about 100° C. to 200° C. for from about one minute to 30 minutes, thereby achieving semi-curing, or the like.

In order to obtain the laminate plate of the present invention by laminating and molding the thus obtained prepreg, for example, there can be adopted a method in which from 1 to 20 sheets of the prepreg are superimposed so as to have a required thickness, a metal foil such as copper, aluminum, etc. is disposed on one surface or both surfaces thereof, and heat pressure molding is performed under a condition at a temperature of from about 100 to 250° C. under a pressure of from about 0.2 to 10 MPa for from about 0.1 to 5 hours by using a multi-stage press, a multi-stage vacuum press, a continuous molding machine, an autoclave molding machine, etc., or the like.

Next, a manufacturing method of the resin composition varnish of the present invention is described.

[Manufacturing Method of Resin Composition Varnish]

The manufacturing method of the resin composition varnish of the present invention includes a first dispersing and mixing step of dispersing and mixing (I) a molybdenum compound in (H) a slurry containing a prescribed silica particle, a second dispersing and mixing step of dispersing and mixing the slurry having gone through the first dispersing and mixing step in a varnish containing (J) a thermosetting resin, and a third dispersing and mixing step of dispersing and mixing (K) an inorganic filler in the varnish having gone through the second dispersing and mixing step.

(First Dispersing and Mixing Step)

The silica particle in the slurry (H) in the first dispersing and mixing step is required to have an average particle size of 0.01 μm or more and not more than 0.1 μm and a specific surface area of 30 $m^2/g$ or more and not more than 270 $m^2/g$.

When the average particle size is 0.01 μm or more and not more than 0.1 μm, and the specific surface area is 30 $m^2/g$ or more and not more than 270 $m^2/g$, at the time of dispersing and mixing the molybdenum compound, the molybdenum compound can be stably kept in a finely dispersed state such that it does not precipitate over a long period of time.

Incidentally, when a cumulative distribution curve by particle size is determined while defining the whole volume of the particles as 100%, the "average particle size" as referred to in this specification means a particle size corresponding to just 50% of the volume, and it can be measured by a particle size distribution analyzer adopting a laser diffraction scattering method, or the like.

Also, the "specific surface area" refers to a total sum of surface areas of the whole of particles contained in the powder per unit mass, and it can be measured by a specific surface area analyzer adopting the BET method, or the like.

Examples of the organic solvent in the slurry include an alcohol such as methanol, ethanol, propanol, butanol, etc.; a glycol ether such as methyl cellosolve, butyl cellosolve, propylene glycol monomethyl ether, etc.; and a ketone such as acetone, methyl ethyl ketone, methyl isobutyl ketone, cyclohexanone, etc.

Of these, from the standpoint that the dispersibility of the molybdenum compound is easily kept in the second dispersing and mixing step, an organic solvent the same as the organic solvent which is used for the varnish containing (J) a thermosetting resin is preferable.

A blending amount of the silica particle in the slurry is preferably 10% by mass or more and not more than 50% by mass, and more preferably 20% by mass or more and not more than 40% by mass. When the blending amount is 10% by mass or more and not more than 50% by mass, the dispersibility of the silica particle in the slurry is excellent, and the dispersibility and stability of the molybdenum compound are favorable.

As the silica slurry satisfying the foregoing requirements, for example, there can be exemplified ADMANANO, manufactured by Admatechs Company Limited.

Examples of the molybdenum compound (I) include molybdenum trioxide, zinc molybdate, ammonium molybdate, magnesium molybdate, calcium molybdate, barium molybdate, sodium molybdate, potassium molybdate, phosphomolybdic acid, ammonium phosphomolybdate, sodium phosphomolybdate, silicomolybdic acid, molybdenum disulfide, molybdenum diselenide, molybdenum ditelluride, molybdenum boride, molybdenum disilicide, molybdenum nitride, molybdenum carbide, and so on. These can be used singly or in admixture of two or more kinds thereof.

Of these, zinc molybdate, calcium molybdate, and magnesium molybdate are preferable because these compounds have low water solubility and low toxicity, have high electrical insulating properties, and have a large improving effect of drilling processability.

In the case of defining the volume of the silica particle contained in the slurry as 1, a blending amount of the molybdenum compound in the silica slurry is preferably 0.2 or more and not more than 5, and more preferably 0.3 or more and not more than 4 in terms of a volume ratio (Mo compound/$SiO_2$). When the volume ratio is 0.2 or more and not more than 5, at the time of dispersing and mixing the molybdenum compound in the slurry, the dispersibility and stability are favorable.

Examples of a method for dispersing and mixing the molybdenum compound in the silica slurry in the first dispersing and mixing step include a method in which the molybdenum compound is first gradually added and well mixed while stirring the slurry, and the mixture is subsequently subjected to a dispersion treatment by a media mill such as a bead mill, a ball mill, etc., a high-speed disperser such as a dissolver, etc., a high-pressure homogenizer such as a nanomizer, etc., a colloid mill, an ultrasonic processor, or the like.

Above all, a method for performing the treatment by a high-speed homogenizer is preferable because incorporation of impurities is small, and the dispersion can be efficiently achieved. Also, a coupling agent such as a silane series, a titanate series, an aluminate series, etc., a modified silicone such as polyether-modified polysiloxane, etc., a polycarboxylic acid, a polymer dispersant such as a urethane series, an acrylate series, etc., or the like can also be added as a dispersant at the time of dispersing and mixing.

(Second Dispersing and Mixing Step)

Examples of the thermosetting resin (J) in the step of the second dispersing and mixing step include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, a melamine resin, and so on. These can be used singly or in admixture of two or more kinds thereof.

Of these, an epoxy resin is preferable from the standpoints of moldability and electrical insulating properties.

Examples of such an epoxy resin include a bisphenol A type epoxy resin, a bisphenol F type epoxy resin, a bisphenol S type epoxy resin, a phenol novolak type epoxy resin, a cresol novolak type epoxy resin, a bisphenol A novolak type epoxy resin, a bisphenol F novolak type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a diglycidyl ether compound of a polyfunctional phenol or a polycyclic aromatic compound such as anthracene, etc., and so on. These can be used singly or in admixture of two or more kinds thereof.

In the case of using an epoxy resin as the thermosetting resin, a curing agent of the epoxy resin can be used, as the need arises.

Examples of the curing agent include a polyfunctional phenol compound such as phenol novolak, cresol novolak, etc.; an amine compound such as dicyandiamide, diaminodiphenylmethane, diaminodiphenylsulfone, etc.; an acid anhydride such as phthalic anhydride, pyromellitic anhydride, maleic anhydride, a maleic anhydride copolymer, etc.; and so on. These can be used singly or in admixture of two or more kinds thereof.

Examples of the organic solvent which is used for the varnish containing a thermosetting resin include an alcohol based solvent such as methanol, ethanol, propanol, butanol, methyl cellosolve, butyl cellosolve, propylene glycol monomethyl ether, etc.; a ketone based solvent such as acetone, methyl ethyl ketone, methyl isobutyl ketone, cyclohexanone, etc.; an ester based solvent such as butyl acetate, propylene glycol monomethyl ether acetate, etc.; an ether based solvent such as tetrahydrofuran, etc.; an aromatic solvent such as toluene, xylene, mesitylene, etc.; a nitrogen atom-containing solvent such as dimethylformamide, dimethylacetamide, N-methylpyrrolidone, etc.; a sulfur atom-containing solvent such as dimethyl sulfoxide, etc.; and so on. These can be used singly or in admixture of two or more kinds thereof.

Of these, from the standpoints of excellent solubility of the thermosetting resin and low toxicity, methyl ethyl ketone, methyl isobutyl ketone, cyclohexanone, and propylene glycol monomethyl ether are preferable.

A solid content concentration of the varnish containing a thermosetting resin is preferably 40% by mass or more and not more than 90% by mass, and more preferably 50% by mass or more and not more than 80% by mass. By allowing the solid content of the varnish to fall within the range of 40% by mass or more and not more than 90% by mass, the dispersibility and stability of the molybdenum compound in the second dispersing and mixing step can be kept favorable.

When the whole of the resin composition excluding the organic solvent finally contained in the resin composition varnish is defined as 100% by volume, a blending amount of the slurry having the molybdenum compound dispersed therein into the varnish is preferably 0.1% by volume or more and not more than 10% by volume in terms of an amount of the molybdenum compound. By allowing the amount of the molybdenum compound to fall within the range of 0.1% by volume or more and not more than 10% by volume, it is possible to realize low thermal expansion of the resin composition while keeping the drilling processability favorable.

Examples of a method for dispersing and mixing the slurry having the molybdenum compound dispersed therein in the varnish containing a thermosetting resin in the second dispersing and mixing step include a method in which the slurry is gradually added and well mixed while stirring the varnish.

(Third Dispersing and Mixing Step)

As the inorganic filler (K) in the third dispersing and mixing step, various material exclusive of the silica particle as the already-described component (H) and the molybdenum compound as the already-described component (I) can be used. Examples thereof include silica, alumina, talc, mica, kaolin, aluminum hydroxide, magnesium hydroxide, zinc borate, zinc stannate, zinc oxide, titanium oxide, boron nitride, calcium carbonate, barium sulfate, aluminum borate, potassium titanate, a glass powder of E-glass, S-glass, D-glass, etc., a hollow glass bead, and so on. These can be used singly or in admixture of two or more kinds thereof.

Of these, silica is preferable from the standpoint of its low coefficient of thermal expansion.

Examples of the silica include precipitated silica which is manufactured by a wet process and which has a high water content; and dry process silica which is manufactured by a dry process and which does not substantially contain bonding water, etc. Furthermore, the dry process silica includes crushed silica, fumed silica, and fused spherical silica depending upon a difference of the manufacturing method. Of these, from the standpoint of excellent fluidity upon being filled in the resin, fused spherical silica is preferable.

In the case of using fused spherical silica as the inorganic filler, its average particle size is preferably from 0.1 μm or more and not more than 10 μm, and more preferably from 0.3 μm or more and not more than 8 μm. When the average particle size of the fused spherical silica is controlled to 0.1 μm or more, the fluidity at the time of filling in the resin can be kept favorable, whereas when it is controlled to not more than 10 μm, a probability of incorporation of coarse particles is reduced, thereby enabling one to suppress the generation of failure.

Incidentally, the average particle size is made to be larger than that of the silica particle as the already-described component (H).

When the whole of the resin composition excluding the organic solvent finally contained in the resin composition varnish is defined as 100% by volume, a blending amount of the inorganic filler into the varnish is preferably 20% by volume or more and not more than 60% by volume, and more preferably 30% by volume or more and not more than 55% by volume. By allowing the blending amount of the inorganic filler to fall within the range of 20% by volume or more and not more than 60% by volume, it is possible to realize low thermal expansion of the resin composition while keeping the moldability favorable.

Examples of a method for dispersing and mixing the inorganic filler in the varnish containing the molybdenum compound and the thermosetting resin in the third dispersing and mixing step include a method in which the inorganic filler is added as it is and mixed; and a method in which the inorganic filler is dispersed in the organic solvent in advance to form a slurry, which is then added and mixed.

Of these, from the standpoint of dispersibility of the inorganic filler in the varnish, a method in which the inorganic filler is converted into a slurry and then added is preferable. At the time of converting the inorganic filler into a slurry, it is preferable to subject the inorganic filler to a pre-treatment with a surface treating agent such as a coupling agent, e.g., a silane series, a titanate series, etc., a silicone oligomer, or the like in advance, or to an integral blend treatment.

In the resin composition varnish having been manufactured through the foregoing respective steps, in addition to the foregoing components, a curing accelerator, a thermoplastic resin, an elastomer, an organic filler, a flame retarder, an ultraviolet ray absorber, an antioxidant, an adhesion enhancer, and the like can be added and used.

Examples of the curing accelerator include an imidazole and a derivative thereof, an organic phosphorus based compound, a secondary amine, a tertiary amine, a quaternary ammonium salt, and so on. These can be used singly or in admixture of two or more kinds thereof.

Examples of the thermoplastic resin include polyethylene, polypropylene, polystyrene, a polyphenylene ether resin, a phenoxy resin, a polycarbonate resin, a polyester resin, a polyamide resin, a polyamide-imide resin, a polyimide resin, a xylene resin, a polyphenylene sulfide resin, a polyether imide resin, a polyetheretherketone resin, a polyether imide resin, a silicone resin, a tetrafluoroethylene resin, and so on.

Examples of the elastomer include polybutadiene, acrylonitrile, epoxy-modified polybutadiene, maleic anhydride-modified polybutadiene, phenol-modified polybutadiene, carboxy-modified acrylonitrile, and so on.

Examples of the organic filler include a resin filler having a homogeneous structure, which is composed of polyethylene, polypropylene, polystyrene, a polyphenylene ether resin, a silicone resin, a tetrafluoroethylene resin, or the like; a resin filler of a core-shell structure having a core layer in a rubber state, which is composed of an acrylic acid ester based resin, a methacrylic acid ester based resin, a conjugated diene based resin, or the like, and a shell layer in a vitreous state, which is composed of an acrylic acid ester based resin, a methacrylic acid ester based resin, an aromatic vinyl based resin, a vinyl cyanide based resin, or the like; and so on.

Examples of the flame retarder include a halogen-containing flame retarder containing bromine or chlorine; a phosphorus based flame retarder such as triphenyl phosphate, tricresyl phosphate, trisdichloropropyl phosphate, red phosphorus, etc.; a nitrogen based flame retarder such as guanidine sulfamate, melamine sulfate, melamine polyphosphate, melamine cyanurate, etc.; a phosphazene based flame retarder such as cyclophosphazene, polyphosphazene, etc.; an inorganic flame retarder such as antimony trioxide, etc.; and so on.

Besides, examples of the ultraviolet ray absorber include a benzotriazole based ultraviolet ray absorber and so on; examples of the antioxidant include a hindered phenol based or hindered amine based antioxidant; and examples of the adhesion enhancer include a coupling agent such as a silane series, a titanate series, an aluminate series, etc.

Incidentally, it is preferable to carryout the addition of these components to the resin composition varnish after the third dispersing and mixing step. Also, a solid content of the finally obtained resin composition varnish is preferably from 40 to 80% by mass, and more preferably from 45 to 75% by mass.

When the solid content is from 40 to 80% by mass, the coating properties of the varnish are favorable, and a prepreg having an appropriate attachment amount of the resin composition can be obtained.

[Prepreg and Laminate Plate]

Next, a prepreg and a laminate plate each using the foregoing resin composition varnish are described.

(Prepreg)

The prepreg of the present invention is one obtained by impregnating or coating a base material with the resin composition varnish obtained by the already-described method for manufacturing a resin composition varnish of the present invention and then performing semi-curing (B-staging) by heating or the like.

Examples of the base material which is used for the prepreg of the present invention include fibers of an inorganic material such as E-glass, D-glass, S-glass, Q-glass, etc.; fibers of an organic material such as an aramid resin, a polyester resin, a tetrafluoroethylene resin, etc.; and mixtures thereof.

Though such a base material has a form of, for example, a woven fabric, a nonwoven fabric, a roving, a chopped strand mat, a surfacing mat, etc., the material and the shape are selected depending on an application or a performance of the target laminate plate, and the material and the shape can be employed solely or in combination of two or more kinds thereof, as the need arises. Also, those having been subjected to a surface treatment with a silane coupling agent, etc., or those having been subjected to a mechanical opening treatment are preferable from the standpoints of heat resistance, moisture resistance, and processability. As for a thickness of the base material, for example, those having a thickness of from 0.01 to 0.2 mm can be used.

(Laminate Plate)

The laminate plate of the present invention is one obtained by lamination and molding by using the prepreg of the present invention. For example, a metal clad laminate plate can be manufactured by performing lamination and molding in a configuration in which from 1 to 20 sheets of the prepreg of the present invention are superimposed, and a metal foil such as copper, aluminum, etc. is disposed on one surface or both surfaces thereof, within the range at a temperature of from about 100 to 250° C. under a pressure of from about 0.2 to 10 MPa for a heating time of from about 0.1 to 5 hours by using a press, a vacuum press, a continuous molding machine, an autoclave molding machine, or the like.

The metal foil is not particularly limited so far as it is one to be used for an application of electronic components. Also, a multi-layered board can be manufactured by combining the prepreg of the present invention with a wiring board for internal layer and laminating and molding the combination.

Each of the above-described prepreg and laminate plate of the present invention has such characteristic features as a low coefficient of thermal expansion and high drilling processability.

EXAMPLES

Next, the present invention is described in more detail with reference to the following Examples, but it should be construed that these Examples do not limit the present invention.

Manufacturing Example 1: Manufacture of Maleimide Compound (A-1)

In a reaction vessel having a capacity of 2 liters and capable of being heated and cooled, which was equipped with a thermometer, an agitator, and a reflux condenser-equipped water quantity meter, 358.0 g of bis(4-maleimidophenyl)methane, 54.5 g of p-aminophenol, and 412.5 g of propylene glycol monomethyl ether were charged and allowed to react with each other for 5 hours while refluxing, thereby obtaining a maleimide compound (A-1).

Manufacturing Example 2: Manufacture of Maleimide Compound (A-2)

In a reaction vessel having a capacity of 2 liters and capable of being heated and cooled, which was equipped with a thermometer, an agitator, and a reflux condenser-equipped water quantity meter, 358.0 g of bis(4-maleimidophenyl)methane, 68.5 g of p-aminobenzoic acid, and 322.5 g of N-dimethylacetamide were charged and allowed to react with each other at 140° C. for 5 hours, thereby obtaining a maleimide compound (A-2).

Examples 1 to 3

The unsaturated maleimide compound (A) having an acidic substituent obtained in Manufacturing Example 1 or 2, and (B) a thermosetting resin and a curing accelerator, (C) an inorganic filler, and (D) a molybdenum compound as described below were dispersed and dissolved in a blending proportion shown in Table 1 in propylene glycol monomethyl ether, thereby obtaining a homogeneous varnish having a content of the resin composition of 70% by mass. This resin composition varnish was impregnated and coated on an E-glass cloth [WEA116E, manufactured by Nitto Boseki Co., Ltd.] having a thickness of 0.1 mm, followed by heating for drying at 150° C. for 5 minutes to obtain a prepreg having a content of the resin composition of 50% by mass. Four sheets of this prepreg were superimposed, and an 18 μm-thick electrolytic copper foil was disposed on the top and bottom, followed by vacuum pressing under a pressure of 3.5 MPa at a temperature of 185° C. for 90 minutes, thereby obtaining a copper clad laminate plate.

Each of the obtained copper clad laminate plates was used and then measured and evaluated with respect to drilling processability, coefficient of thermal expansion, and heat resistance by the following methods. The results are shown in Table 1.

(B) Thermosetting Resin:
B-1: Biphenyl aralkyl type epoxy resin [NC-3000, manufactured by Nippon Kayaku Co., Ltd.]
B-2: Phenol novolak type epoxy resin [EPICLON N-770, manufactured by DIC Corporation]
B-3: Cresol novolak type phenol resin [PHENOLITE KA-1165, manufactured by DIC Corporation]
Curing Accelerator: 2-Ethyl-4-methyl imidazole[2E4MI, manufactured by Shikoku Chemicals Corporation]
(C) Inorganic Filler:
C-1: Fused spherical silica slurry [SC2050-KC, manufactured by Admatechs Company Limited, average particle size: 0.5 μm, solid content: 70% by mass]
C-2: Aluminum hydroxide [CL-310, manufactured by Sumitomo Chemical Co., Ltd.]
C-3: Burnt talc [ST-100, manufactured by Fuji Talc Industrial Co., Ltd.]

(D) Molybdenum Compound:
D-1: Zinc molybdate [a reagent, manufactured by Strem Chemicals Inc.]
D-2: Zinc molybdate-supported talc [KEMIGARD 911C, manufactured by Sherwin-Williams Company, zinc molybdate: 20% by mass]
D-3: Calcium molybdate [a reagent, manufactured by Strem Chemicals Inc.]

Comparative Example 1

A copper clad laminate plate using a resin composition was obtained in the same manner as that in Example 1, except that the molybdenum compound (D) was not blended. The measurement and evaluation results are shown in Table 1.

Comparative Example 2

A copper clad laminate plate using a resin composition was obtained in the same manner as that in Example 1, except that the unsaturated maleimide compound (A) having an acidic substituent was not blended. The measurement and evaluation results are shown in Table 1.

Comparative Example 3

A copper clad laminate plate using a resin composition was obtained in the same manner as that in Example 1, except that the inorganic filler (C) was not blended. The measurement and evaluation results are shown in Table 1.

<Evaluation of Drilling Proccessability, Coefficient of Thermal Expansion, and Heat Resistance of Copper Clad Laminate Plate>

(1) Evaluation of Drilling Proccessability:

Two sheets of the copper clad laminate plate were superimposed; an aluminum foil having a thickness of 0.1 mm was disposed thereabove, whereas a paper phenol board having a thickness of 1.5 mm was disposed thereunder; 6,000 holes were drilled with a drill having a diameter of 0.2 mm by using a drilling machine [ND-1V212, manufactured by Hitachi Via Mechanics, Ltd.] under a condition at a rotation number of 160 krpm and a feed rate of 2 m/min under a chip load of 12.5 μm/rev; and a wear amount of drill cutting blade and hole registration accuracy were measured by the following methods, thereby evaluating the drilling processability.

(a) Wear Amount of Drill Cutting Blade:

A drilling cutting blade portion before and after drilling was observed from the drill central axis by using an inspection microscope [MX50, manufactured by Olympus Corporation], and a wear retreat amount of cutting blade edge was measured and defined as the wear amount of drill cutting blade.

(b) Hole Registration Accuracy:

Of the two-ply copper clad laminate plates, a registration deviation amount of holes of the lower side (drill exit side) of the second sheet was measured using a hole registration accuracy analyzer [HT-1AM, manufactured by Hitachi Via Mechanics, Ltd.], and average +3σ (σ: standard deviation) of registration deviation amounts of the 4,001st to 6,000th hit holes was calculated and defined as the hole registration accuracy.

(2) Measurement of Coefficient of Thermal Expansion:

After removing the copper foil of the copper clad laminate plate with an etching liquid, the resulting laminate plate was cut into a size of 5 mm square, thereby fabricating a specimen. A coefficient of thermal expansion of this specimen in the machine direction (longitudinal direction of the glass cloth) at from 50° C. to 120° C. was measured at a temperature rising rate of 10° C./min by using a TMA test apparatus (TMA2940, manufactured by TA Instruments).

(3) Evaluation of Heat Resistance (Glass Transition Temperature):

After removing the copper foil of the copper clad laminate plate with an etching liquid, the resulting laminate plate was cut into a size of 5 mm square, thereby fabricating a specimen. A temperature-dimension change curve of this specimen in the thickness direction was measured at a temperature rising rate of 10° C./min by using a TMA test apparatus (TMA2940, manufactured by Du Pont), and a temperature of a point of intersection between an approximate straight line of low temperature side and an approximate straight line of high temperature side in the temperature-dimension change curve was determined as a glass transition temperature and evaluated for the heat resistance.

TABLE 1

|  | Example 1 | Example 2 | Example 3 | Comparative Example 1 | Comparative Example 2 | Comparative Example 3 |
|---|---|---|---|---|---|---|
| Use amount (parts by mass) |  |  |  |  |  |  |
| A: Unsaturated maleimide compound having an acidic substituent |  |  |  |  |  |  |
| A-1 (Manufacturing Example 1) | 65 |  | 65 | 65 |  | 65 |
| A-2 (Manufacturing Example 2) |  | 50 |  |  |  |  |
| B: Thermosetting resin |  |  |  |  |  |  |
| B-1 (Biphenyl aralkyl type epoxy resin) | 35 |  | 35 | 35 |  | 35 |
| B-2 (Phenol novolak type epoxy resin) |  | 50 |  |  | 61 |  |
| B-3 (Cresol novolak type phenol resin) |  |  |  |  | 39 |  |
| Curing accelerator: 2-Ethyl-4-methyl imidazole | 0.5 | 0.25 | 0.5 | 0.5 | 0.15 | 0.5 |
| C: Inorganic filler |  |  |  |  |  |  |
| C-1 (Fused spherical silica slurry: SC2050-KC) | 199 | 124 | 81 | 199 | 124 |  |
| C-2: (Aluminum hydroxide: CL-310) |  | 34 |  |  | 34 |  |
| C-3: (Burnt talc: ST-100) |  |  | 48 | 54 |  |  |

TABLE 1-continued

|  | Example 1 | Example 2 | Example 3 | Comparative Example 1 | Comparative Example 2 | Comparative Example 3 |
|---|---|---|---|---|---|---|
| D: Molybdenum compound |  |  |  |  |  |  |
| D-1 (Zinc molybdate) | 86 |  |  |  |  | 154 |
| D-2 (Zinc molybdate-supported talc, 10% supported) |  | 6.0 |  |  | 6.0 |  |
| D-3 (Calcium molybdate) |  |  | 5.6 |  |  |  |
| Composition (% by volume) |  |  |  |  |  |  |
| A + B: Unsaturated maleimide compound + Thermosetting resin | 50 | 60 | 79 | 50 | 60 | 70 |
| C: Inorganic filler | 38 | 38.5 | 20 | 38 | 38.5 |  |
| D: Molybdenum compound | 12 | 1.5 | 1.0 | 12 | 1.5 | 30 |
| Measurement and evaluation |  |  |  |  |  |  |
| (1) Drilling processability |  |  |  |  |  |  |
| Wear amount of drill cutting blade (μm) | 11 | 9 | 7 | 31 | 8 | 5 |
| Hole registration accuracy (μm) | 31 | 30 | 28 | 48 | 29 | 25 |
| (2) Coefficient of thermal expansion ($10^{-6}$/° C.) | 10.8 | 11.4 | 11.7 | 10.7 | 14.1 | 14.5 |
| (3) Heat resistance (glass transition temperature: ° C.) | 210 | 220 | 215 | 212 | 175 | 199 |

The use amount (parts by mass) in Table 1 is a blending amount of each of the components regarding the resin compositions of the Examples and Comparative Examples, as expressed in terms of parts by mass in the case where a total sum blending amount of the unsaturated maleimide compound (A) having an acidic substituent and the thermosetting resin (B) is defined as 100 parts by mass. However, in Comparative Example 2, since the maleimide compound (A) is not blended, the total sum blending amount of the thermosetting resin (B) and the cresol novolak type phenol resin was shown as 100 parts by mass.

As is clear from Table 1, all of the Examples of the present invention are low in the coefficient of thermal expansion and excellent in the drilling processability and heat resistance.

On the other hand, though Comparative Example 1 is low in the coefficient of thermal expansion and excellent in the heat resistance, it is significantly inferior in the drilling processability because the molybdenum compound (D) of the present invention is not contained therein.

Also, though Comparative Examples 2 and 3 are excellent in the drilling processability, they are high in the coefficient of thermal expansion and inferior in the heat resistance because the unsaturated maleimide compound (A) having an acidic substituent or the inorganic filler (C) of the present invention is not contained therein.

Examples 4, 6 and 7 and Comparative Example 4

In blends shown in Tables 2 and 3, first of all, (E) a thermosetting resin and a curing agent were completely dissolved in an organic solvent; subsequently, (F) a silica slurry was added; and stirring was performed until the both were thoroughly mixed. Thereafter, (G) a molybdenum compound was gradually added; stirring was continued until an aggregated block disappeared; and finally, a curing accelerator was added, and stirring was performed for one hour such that the whole of the varnish became homogenous.

Each of the thus obtained thermosetting resin composition varnishes was impregnated and coated on an E-glass cloth (WEA116E, manufactured by Nitto Boseki Co., Ltd.) having a thickness of 0.1 mm, followed by heating for drying at 160° C. for 5 minutes to achieve semi-curing, thereby obtaining a prepreg having a proportion of the resin composition of 48% by mass.

A prescribed number of sheets of this prepreg were superimposed so as to be a required thickness, an electrolytic copper foil [GTS-12, manufactured by Furukawa Electric Co., Ltd.] having a thickness of 12 μm was disposed on the both surfaces, followed by heat pressure molding under a pressure of 4 MPa at a temperature of 185° C. for 90 minutes by using a vacuum press, thereby obtaining a copper clad laminate plate.

Example 5 and Comparative Example 5

Copper clad laminate plates were obtained in the same manner as that in Examples 4, 6 and 7 and Comparative Example 4, except that at the time of blending the thermosetting resin composition varnish, after adding the silica slurry (F) and before adding the molybdenum compound (G), an inorganic filler (aluminum hydroxide) was added, and the components were thoroughly stirred and mixed.

Comparative Examples 6 and 7

Copper clad laminate plates were obtained in the same manner as that in Examples 4, 6 and 7 and Comparative Example 4, except that at the time of blending the thermosetting resin composition varnish, after adding the silica slurry (F), an inorganic filler (burnt talc or molybdenum disulfide) was added; the components were stirred until an aggregated block disappeared; and finally, a curing accelerator was added, and stirring was performed for one hour such that the whole of the varnish became homogenous.

TABLE 2

| Component |  | Example 4 | Example 5 | Example 6 | Example 7 |
|---|---|---|---|---|---|
| (E) Thermosetting resin | E-1 |  | 100 |  | 100 |
|  | E-2 | 60 |  | 60 |  |
|  | E-3 | 40 |  | 40 |  |
| Curing agent |  | 52 | 63 | 52 | 63 |
| Curing accelerator |  | 0.3 | 0.2 | 0.32 | 0.25 |
| (F) Silica | F-1 |  | 170 (23) | 391 (49) | 282 (40) |
|  | F-2 | 558 (56) |  |  |  |
| (G) Molybdenum compound | G-1 | 54.6 (4) |  |  |  |
|  | G-2 |  | 13.1 (2) |  |  |
|  | G-3 |  |  | 10.4 (1) |  |
|  | G-4 |  |  |  | 4.5 (0.5) |

TABLE 2-continued

| Component | | Example 4 | Example 5 | Example 6 | Example 7 |
|---|---|---|---|---|---|
| Inorganic filler 3 | | | 96 | | |
| Organic solvent | | 89 | 117 | 70 | 72 |

TABLE 3

| Component | | Comparative Example 4 | Comparative Example 5 | Comparative Example 6 | Comparative Example 7 |
|---|---|---|---|---|---|
| (E) Thermosetting resin | E-1 | | 100 | | 100 |
| | E-2 | 60 | | 60 | |
| | E-3 | 40 | | 40 | |
| Curing agent | | 52 | 63 | 52 | 63 |
| Curing accelerator | | 0.25 | 0.2 | 0.32 | 0.35 |
| (F) Silica | F-1 | | 110 (15) | 391 (49) | 282 (40) |
| | F-2 | 824 (62) | | | |
| (G) Molybdenum compound | G-1 | 146 (8) | | | |
| | G-2 | | 6.6 (1) | | |
| Inorganic filler 1 | | | | 8.1 | |
| Inorganic filler 2 | | | | | 5.4 |
| Inorganic filler 3 | | | 148 | | |
| Organic solvent | | 128 | 136 | 69 | 72 |

Here, a blending amount of each of the components in Tables 2 and 3 was expressed in terms of parts by mass in the case where a total sum blending amount of the thermosetting resin (E) as defined as 100. However, with respect to the silica (F) and the molybdenum compound (G), a value of % by volume relative to the whole of the resin composition was also expressed in each of the parentheses. Also, the following materials were used as the respective components in Tables 2 and 3.

(E) Thermosetting Resin:

E-1: Phenol novolak type epoxy resin [EPICLON N-770, manufactured by DIC Corporation]

E-2: Bisphenol A novolak type epoxy resin [EPICLON N-865, manufactured by DIC Corporation]

E-3: Biphenyl aralkyl type epoxy resin [NC-3000, manufactured by Nippon Kayaku Co., Ltd.]

Curing agent: Cresol novolak type phenol resin [PHENOLITE KA-1165, manufactured by DIC Corporation]

Curing accelerator: 2-Ethyl-4-methylimidazole [CUREZOL 2E4MZ, manufactured by Shikoku Chemicals Corporation]

(F) Silica:

F-1: Fused spherical silica slurry [SC2050-KC, manufactured by Admatechs Company Limited, average particle size: 0.5 μm, solid content: 70% by mass]

F-2: Fused spherical silica slurry [SC4050-KNA, manufactured by Admatechs Company Limited, average particle size: 1.0 μm, solid content: 70% by mass]

(G) Molybdenum Compound:

G-1: Zinc molybdate [a reagent, manufactured by Strem Chemicals Inc., average particle size: 2 μm]

G-2: Zinc molybdate-supported talc [KEMIGARD 911C, manufactured by Sherwin-Williams Company, average particle size: 3 μm]

G-3: Calcium molybdate [a reagent, manufactured by Strem Chemicals Inc., average particle size: 2 μm]

G-4: Magnesium molybdate [a reagent, manufactured by Mitsuwa Chemicals Co., Ltd., average particle size: 3 μm]

Inorganic filler 1: Burnt talc [BST, manufactured by Nippon Talc Co., Ltd.]

Inorganic filler 2: Molybdenum disulfide [A Powder, manufactured by Nichimoly Division, Daizo Corporation]

Inorganic filler 3: Aluminum hydroxide [C-303, manufactured by Sumitomo Chemical Co., Ltd.]

Organic solvent: Cyclohexanone [manufactured by Godo Co., Ltd.]

Each of the copper clad laminate plates obtained in the foregoing Examples and Comparative Examples was measured and evaluated with respect to characteristics by the following methods. The measurement and evaluation results are shown in Tables 4 and 5.

(1) Evaluation of Drilling Proccessability:

Two sheets of a copper clad laminate plate having a thickness of 0.4 mm were superimposed; a paper phenol board having a thickness of 0.4 mm was disposed thereabove, whereas a paper phenol board having a thickness of 1.5 mm was disposed thereunder; 6,000 holes were drilled with a drill having a diameter of 0.2 mm by using a drilling machine [ND-1V212, manufactured by Hitachi Via Mechanics, Ltd.] under a condition at a rotation number of 160 krpm and a feed rate of 1.8 m/min under a chip load of 11.25 μm/rev; and a wear amount of drill cutting blade and hole registration accuracy were measured by the following methods, thereby evaluating the drilling processability.

(a) Wear Amount of Drill Cutting Blade:

A drilling cutting blade portion of a new product (before drilling) and after drilling was observed from the drill central axis by using a scanning electron microscope [S-4700, manufactured by Hitachi, Ltd.], and a wear retreat amount of cutting blade edge was measured and defined as the wear amount of drill cutting blade.

(b) Hole Registration Accuracy:

Of the two-ply copper clad laminate plates, a registration deviation amount of holes of the lower side (drill exit side) of the second sheet was measured using a hole registration accuracy analyzer [HT-1AM, manufactured by Hitachi Via Mechanics, Ltd.], and average +3σ (σ: standard deviation) of registration deviation amounts of the 4,001st to 6,000th hit holes was calculated and defined as the hole registration accuracy. So far as the hole registration accuracy is not more than 35 μm, favorable results are revealed without causing a problem in view of the practical use.

(2) Measurement of Coefficient of Thermal Expansion:

After removing a copper foil of a copper clad laminate plate having a thickness of 0.8 mm with an etching liquid, the resulting laminate plate was cut into a size of 5 mm square, thereby fabricating a specimen. An average coefficient of linear thermal expansion of this specimen in the machine direction (longitudinal direction of the glass cloth) at from 50° C. to 120° C. was measured at a temperature rising rate of 10° C./min by using a TMA test apparatus [TMA2940, manufactured by TA Instruments]. The closer the coefficient of thermal expansion to a coefficient of thermal expansion of a silicon chip (from $4 \times 10^{-6}$/° C. to $5 \times 10^{-6}$/° C.), the more favorable the results are.

(3) Measurement of Electrical Insulating Properties:

After removing a copper foil on one surface of a copper clad laminate plate having a thickness of 0.1 mm with an etching liquid while leaving a circular portion having a diameter of 20 mm, the resulting laminate plate was cut into a size of 50 mm square such that the circular portion was located in the center, thereby fabricating a specimen. This specimen was dipped in FLUORINERT [manufactured by Sumitomo 3M Limited] and subjected to a dielectric breakdown test under a condition at a pressure rising rate of 5 kV/10 sec. by using a withstanding voltage meter [PT-1011, manufactured by TOA Electronics Ltd.], thereby measuring a dielectric breakdown voltage. So far as the dielectric breakdown voltage is 6 kV or more, favorable results are revealed without causing a problem in view of the practical use.

(4) Evaluation of Moldability:

A copper clad laminate plate having a thickness of 0.4 mm was cut into a size of 5 mm square and cast with a casting resin, and the cut surface was polished to fabricate a specimen for cross section observation. The polished surface of this specimen was subjected to milling by a flat milling apparatus [E-3200, manufactured by Hitachi, Ltd.] and then observed by using a scanning electron microscope [S-4700, manufactured by Hitachi, Ltd.] to examine the presence or absence of a void, thereby evaluating the moldability.

TABLE 4

| | Item | Unit | Example 4 | Example 5 | Example 6 | Example 7 |
|---|---|---|---|---|---|---|
| Drilling processability | Wear amount of drill cutting blade | μm | 11 | 8 | 9 | 10 |
| | Hole registration accuracy | μm | 34 | 31 | 30 | 31 |
| Coefficient of thermal expansion | | $10^{-6}/°C$ | 10.8 | 13.1 | 11.3 | 13.1 |
| Electrical insulating properties | | kV | 6.9 | 7.7 | 7.1 | 8.0 |
| Moldability (presence or absence of void) | | — | Absent | Absent | Absent | Absent |

TABLE 5

| | Item | Unit | Comparative Example 4 | Comparative Example 5 | Comparative Example 6 | Comparative Example 7 |
|---|---|---|---|---|---|---|
| Drilling processability | Wear amount of drill cutting blade | μm | 18 | 7 | 28 | 13 |
| | Hole registration accuracy | μm | 42 | 31 | 50 | 38 |
| Coefficient of thermal expansion | | $10^{-6}/°C$ | 10.3 | 14.9 | 11.3 | 13.2 |
| Electrical insulating properties | | kV | 3.5 | 7.6 | 7.1 | 2.6 |
| Moldability (presence or absence of void) | | — | Present | Absent | Absent | Absent |

As is clear from Table 4, all of the Examples of the present invention are excellent in the drilling processability and low thermal expansion properties and are of no problem in the electrical insulating properties and moldability.

On the other hand, as is clear from Table 5, in Comparative Example 4, since the content of silica exceeds 60% by volume of the whole of the resin composition, the moldability is significantly inferior and lowered in the drilling processability and electrical insulating properties. In Comparative Example 5, since the content of silica is less than 20% by volume of the whole of the resin composition, there is such a problem that the coefficient of thermal expansion is large. In Comparative Example 6, since the molybdenum compound of the present invention is not contained, the drilling processability is significantly inferior. Similarly, in Comparative Example 7, since the molybdenum compound of the present invention is not contained, and molybdenum disulfide is contained, the electrical insulating properties are significantly inferior.

Examples 8 and 9 and Comparative Examples 8 and 9

In blends of resin composition varnishes shown in Table 6, first of all, (I) a molybdenum compound was gradually added to (H) a silica slurry and mixed while stirring such that an aggregated block was not formed. This silica slurry having the molybdenum compound mixed therewith was treated three times under a condition at an air pressure of 0.5 MPa by using a nanomizer (NM2000-AR, manufactured by Yoshida Kikai Co., Ltd.), thereby thoroughly dispersing and mixing the molybdenum compound and the silica particles.

Subsequently, this molybdenum compound-dispersed silica slurry was gradually added to a resin varnish which had been prepared by dissolving (J) a thermosetting resin and a curing agent in an organic solvent, while stirring, and after the whole amount was completely added, the components were stirred for one hour until the whole became homogenous.

Thereafter, (K) an inorganic filler slurry was added to the resin varnish while stirring, to which was then further added a curing accelerator, and the components were stirred for one hour until the whole became homogenous, thereby preparing a resin composition varnish.

A solid content concentration of each of the resin composition varnishes of Examples 8 and 9 and Comparative Examples 8 and 9 was 70% by mass.

Comparative Example 10

In a blend of a resin composition varnish shown in Table 6, (I) a molybdenum compound was gradually added to a resin varnish which had been prepared by dissolving (J) a thermosetting resin and a curing agent in an organic solvent, while stirring, and after the whole amount was completely added, the components were stirred for one hour until the whole became homogenous.

Thereafter, (K) an inorganic filler slurry was added to the resin varnish while stirring, to which was then further added a curing accelerator, and the components were stirred for one hour until the whole became homogenous, thereby preparing a resin composition varnish.

A solid content concentration of the resin composition varnishes of Comparative Example 10 was 70% by mass.

Comparative Example 11

In a blend of a resin composition varnish shown in Table 6, first of all, (I) a molybdenum compound was gradually added to (H) a silica slurry and mixed while stirring such that an aggregated block was not formed. This silica slurry having the molybdenum compound mixed therewith was treated three times under a condition at an air pressure of 0.5 MPa by using a nanomizer (NM2000-AR, manufactured by Yoshida Kikai Co., Ltd.), thereby thoroughly dispersing and mixing the molybdenum compound and the silica particles.

Subsequently, this molybdenum compound-dispersed silica slurry was gradually added to a slurry of (K) an inorganic filler while stirring, and after the whole amount was completely added, the components were stirred for one hour until the whole became homogenous.

Thereafter, this slurry was added to a resin varnish which had been prepared by dissolving (J) a thermosetting resin and a curing agent in an organic solvent, while stirring, to which was then further added a curing accelerator, and the components were stirred for one hour until the whole became homogenous, thereby preparing a resin composition varnish.

A solid content concentration of the resin composition varnishes of Comparative Example 11 was 70% by mass.

Each of the resin composition varnishes manufactured in the foregoing Examples and Comparative Examples was impregnated and coated on an E-glass cloth (WEA116E, manufactured by Nitto Boseki Co., Ltd.) having a thickness of 0.1 mm, followed by heating for drying at 160° C. for 5 minutes, thereby obtaining a prepreg having a content of the resin composition of 48% by mass. Four sheets of this prepreg were superimposed, and an electrolytic copper foil having a thickness of 12 μm was disposed on the top and bottom, followed by vacuum pressing under a pressure of 3.8 MPa at a temperature of 185° C. for 90 minutes, thereby obtaining a copper clad laminate plate.

By using the thus obtained resin composition varnish and copper clad laminate plate, precipitation properties of the resin composition varnish, the presence or absence of an aggregate in the varnish, drilling processability of the copper clad laminate plate, and a coefficient of thermal expansion were measured and evaluated by the following methods. The evaluation results are summarized in Table 7.

(1) Evaluation of Precipitation Properties of Resin Composition Varnish:

500 cm$^3$ of the resin composition varnish was taken in a glass-made settling tube having a diameter of 5 cm and a length of 35 cm and allowed to stand at room temperature of 25° C., and a time until a precipitate accumulated on the bottom of the settling tube was measured, thereby evaluating the precipitation properties.

(2) Evaluation of Presence or Absence of Aggregate in Resin Composition Varnish:

100 cm$^3$ of the resin composition varnish was taken in a flask, to which was then added 400 cm$^3$ of an organic solvent the same as that used in the varnish, and the mixture was well shaken. This dilute varnish was filtered through a nylon mesh having an opening of 20 μm, and whether or not a residue remained on the mesh was visually confirmed, thereby evaluating the presence or absence of an aggregate.

(3) Evaluation of Drilling Proccessability of Copper Clad Laminate Plate:

Two sheets of a copper clad laminate plate were superimposed; an aluminum foil having a thickness of 0.15 mm was disposed thereabove, whereas a paper phenol board having a thickness of 1.5 mm was disposed thereunder; 6,000 holes were drilled with a drill φ0.2 mm by using a drilling machine [ND-1V212, manufactured by Hitachi Via Mechanics, Ltd.] under a condition at a rotation number of 160 krpm and a feed rate of 2 m/min under a chip load of 12.5 μm/rev; and a wear amount of drill cutting blade and hole registration accuracy were measured by the following methods, thereby evaluating the drilling processability.

(a) Wear Amount of Drill Cutting Blade:

A drilling cutting blade portion before and after drilling was observed from the drill central axis by using a scanning electron microscope (S-4700, manufactured by Hitachi, Ltd.), and a wear retreat amount of cutting blade edge was measured and defined as the wear amount of drill cutting blade.

(b) Hole Registration Accuracy:

Of the two-ply copper clad laminate plates, a registration deviation amount of holes of the lower side (drill exit side) of the second sheet was measured using a hole registration accuracy analyzer (HT-1AM, manufactured by Hitachi Via Mechanics, Ltd.), and average +3σ (σ: standard deviation) of registration deviation amounts of the 4,001st to 6,000th hit holes was calculated and defined as the hole registration accuracy.

(4) Measurement of Coefficient of Thermal Expansion of Copper Clad Laminate Plate:

After removing a copper foil of a copper clad laminate plate with an etching liquid, the resulting laminate plate was cut into a size of 5 mm square, thereby fabricating a specimen. A coefficient of thermal expansion of this specimen in the machine direction (longitudinal direction of the glass cloth) at from 50° C. to 120° C. was measured at a temperature rising rate of 10° C./min by using a TMA test apparatus (TMA2940, manufactured by TA Instruments).

TABLE 6

| Component | | Example 8 | Example 9 | Comparative Example 8 | Comparative Example 9 | Comparative Example 10 | Comparative Example 11 |
|---|---|---|---|---|---|---|---|
| (H) Slurry having silica particle dispersed in organic solvent | H-1 | 20 | | | | | 20 |
| | H-2 | | 30 | | | | |
| | H-3 | | | 12 | | | |
| | H-4 | | | | 60 | | |
| (I) Molybdenum compound | I-1 | 23.4 | | 23.4 | 23.4 | | 23.4 |
| | I-2 | | 23.9 | | | | |
| | I-3 | | | | | 19.0 | |

TABLE 6-continued

| Component | Example 8 | Example 9 | Comparative Example 8 | Comparative Example 9 | Comparative Example 10 | Comparative Example 11 |
|---|---|---|---|---|---|---|
| (J) Thermosetting resin | 100 | 100 | 100 | 100 | 100 | 100 |
| Curing agent | 63 | 63 | 63 | 63 | 63 | 63 |
| Curing accelerator | 1 | 1 | 1 | 1 | 1 | 1 |
| Organic solvent | 69 | 59 | 77 | 29 | 79 | 69 |
| (K) Inorganic filler | 402 (47) | 402 (47) | 402 (47) | 402 (47) | 406 (47.5) | 402 (47) |

Unit: Parts by mass (however, % by volume in the parenthesis)

Table 6 shows a blend regarding the resin composition varnish manufactured by the manufacturing method of each of the Examples and Comparative Examples, as expressed in terms of parts by mass in the case where the blending amount of the thermosetting resin (J) is defined as 100 parts by mass. However, with respect to each of the slurry having the silica particle (H) dispersed in an organic solvent and the inorganic filler (K), the blending amount including the organic solvent contained therein is shown. Of these, with respect to (K), a value of % by volume of the inorganic filler in the case where the whole of the resin composition exclusive of the organic solvent contained in the resin composition varnish is defined 100% by volume was also expressed in each of the parentheses. Also, with respect to the molybdenum compound (I), in the case of using a particle in which the molybdenum compound is supported by other substance, a blending amount as the supported particle but not the molybdenum compound alone is shown.

Also, the following materials were used as the respective components in Table 6.

(I) Molybdenum compound I-1: Zinc molybdate (a reagent, manufactured by Strem Chemicals Inc.)
(I) Molybdenum compound I-2: Calcium molybdate (a reagent, manufactured by Strem Chemicals Inc.)
(I) Molybdenum compound I-3: Zinc molybdate-supported talc, zinc molybdate content: 10% by mass (KEMIGARD 911C, manufactured by Sherwin-Williams Company)
(J) Thermosetting resin: Phenol novolak type epoxy resin (EPICLON N-770, manufactured by DIC Corporation)
Curing agent: Cresol novolak type phenol resin (PHENO-LITE KA-1165, manufactured by DIC Corporation)
Curing accelerator: 2-Ethyl-4-methyl imidazole [(2E4MI, manufactured by Shikoku Chemicals Corporation)
Organic solvent: Propylene glycol monomethyl ether (manufacture by Godo Co., Ltd.)
(K) Inorganic filler: Fused spherical silica slurry, average particle size: 0.5 μm, specific surface area: 7 $m^2/g$, silica blending amount: 70% by mass (SC2050-KC, manufactured by Admatechs Company Limited)

TABLE 7

| Item | | Unit | Example 8 | Example 9 | Comparative Example 8 | Comparative Example 9 | Comparative Example 10 | Comparative Example 11 |
|---|---|---|---|---|---|---|---|---|
| Precipitation properties | | h | 72 | 84 | 12 | 84 | 48 | 72 |
| Aggregate | | — | No | No | No | Yes | Yes | Yes |
| Drilling processability | Wear amount of drill cutting blade | μm | 10 | 9 | 12 | 10 | 12 | 10 |
| | Hole registration accuracy | μm | 30 | 31 | 30 | 34 | 35 | 31 |
| Coefficient of thermal expansion | | $10^{-6}/°C.$ | 11.5 | 11.7 | 11.4 | 12.0 | 11.3 | 11.5 |

(H) Silica slurry H-1: Slurry in which silica having an average particle size of 0.05 μm and a specific surface area of 55 $m^2/g$ is dispersed in a silica blending amount of 30% by mass in propylene glycol monomethyl ether (ADMANANO, manufactured by Admatechs Company Limited)
(H) Silica slurry H-2: Slurry in which silica having an average particle size of 0.025 μm and a specific surface area of 110 $m^2/g$ is dispersed in a silica blending amount of 20% by mass in propylene glycol monomethyl ether (ADMANANO, manufactured by Admatechs Company Limited)
(H) Silica slurry H-3: Slurry in which silica (SO-25R, manufactured by Admatechs Company Limited) having an average particle size of 0.5 μm and a specific surface area of 7 $m^2/g$ is dispersed in a silica blending amount of 50% by mass in propylene glycol monomethyl ether
(H) Silica slurry H-4: Slurry in which silica (380, manufactured by Nippon Aerosil Co., Ltd.) having an average particle size of 0.05 μm and a specific surface area of 380 $m^2/g$ is dispersed in a silica blending amount of 10% by mass in propylene glycol monomethyl ether As is clear from Table 7, the Examples of the present invention are excellent in all of the issues regarding the precipitation properties and presence or absence of an aggregate of the resin composition varnish, and the drilling processability and coefficient of thermal expansion of the copper clad laminate plate.

On the other hand, in Comparative Example 8, since the silica particle in the slurry (H) is large in the average particle size and small in the specific surface area, the precipitation properties of the resin composition varnish are significantly inferior.

Also, in Comparative Example 9, since the silica particle in the slurry (H) is large in the specific surface area, the aggregate remains in the resin composition varnish, and the hole registration accuracy is slightly deteriorated. In Comparative Example 10, since the molybdenum compound-supported talc is added directly to the resin varnish, the precipitation properties of the resin composition varnish are inferior, and the aggregate remains. Furthermore, the hole registration accuracy is slightly deteriorated. In Comparative Example 11, since the molybdenum compound-dispersed silica slurry is added to the inorganic filler slurry and then added to the resin varnish, the aggregate remains in the resin composition varnish.

Incidentally, if a printed wiring board is fabricated in a state in which the aggregate remains in the resin composition varnish, there is a concern that abnormal deposition of a plating to be caused due to molybdenum, or the like is easily generated during the manufacture, thereby impairing the reliability as an electronic appliance, and therefore, such is not preferable.

In the light of the above, according to the present invention, a resin composition varnish in which the precipitation or aggregation of a molybdenum compound hardly occurs can be manufactured, and by using this, a prepreg and a laminate plate, each of which has a low coefficient of thermal expansion and high drilling processability and which is suitable for semi-conductor packages or printed wiring boards, can be obtained.

INDUSTRIAL APPLICABILITY

The thermosetting resin composition of the present invention is especially low in thermal expansion properties and excellent in drilling processability and heat resistance, and it is suitably used for electronic components, etc. Also, according to the laminate plate for wiring boards of the present invention, it is possible to provide a laminate plate for wiring boards, which is very excellent in drilling processability at the time of fabricating a wiring board and which also has favorable electrical insulating properties and low thermal expansion properties. Furthermore, according to the varnish obtained by the method for manufacturing a resin composition varnish of the present invention, it is possible to provide a prepreg and a laminate plate each having high drilling processability.

The invention claimed is:

1. A method for manufacturing a wiring board to be used for semiconductor packages, comprising: a step of drilling processing for drilling a hole in a copper clad laminate plate which comprises a prepreg,
   wherein the prepreg comprises a thermosetting resin composition comprising a component (A) comprising an unsaturated maleimide compound having an acidic substituent, a component (B) comprising a thermosetting resin, a component (C) comprising an inorganic filler, and a component (D) comprising a molybdenum compound.

2. The method according to claim 1, wherein the hole is drilled in the copper clad laminate plate, after disposition of aluminum foil above the copper clad laminate plate and disposition of a paper phenol board under the copper clad laminate plate, in the step of drilling processing.

3. The method according to claim 1, wherein the component (D) comprises one or more selected from the group consisting of molybdenum trioxide, zinc molybdate, ammonium molybdate, magnesium molybdate, calcium molybdate, barium molybdate, sodium molybdate, potassium molybdate, phosphomolybdic acid, ammonium phosphomolybdate, sodium phosphomolybdate, silicomolybdic acid, molybdenum boride, molybdenum disilicide, molybdenum nitride, and molybdenum carbide.

4. The method according to claim 1, wherein the component (B) comprises one or more selected from the group consisting of an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin.

5. The method according to claim 1, wherein the component (C) comprises one or more selected from the group consisting of silica, alumina, talc, mica, kaolin, aluminum hydroxide, magnesium hydroxide, zinc borate, zinc stannate, zinc oxide, titanium oxide, boron nitride, calcium carbonate, barium sulfate, aluminum borate, potassium titanate, a glass powder, and hollow glass beads.

6. The method according to claim 5, wherein the component (C) comprises the glass powder, and the glass powder comprises one or more selected from E-glass, S-glass, and D-glass.

7. The method according to claim 1, wherein the component (C) comprises a fused spherical silica having an average particle size from 0.1 to 10 μm.

8. The method according to claim 1, wherein the component (D) comprises one or more selected from the group consisting of a molybdenum oxide and a molybdic acid compound.

9. The method according to claim 1, wherein a total sum content of the component (A) and the component (B) is from 30 to 80% by volume of the whole of the resin composition.

10. The method according to claim 1, wherein a content of the component (C) is from 10 to 60% by volume of the whole of the resin composition.

11. The method according to claim 1, wherein a content of the component (D) is from 0.02 to 20% by volume of the whole of the resin composition.

* * * * *